(12) United States Patent
Xiong et al.

(10) Patent No.: US 11,875,754 B2
(45) Date of Patent: Jan. 16, 2024

(54) DISPLAY PANEL, METHOD FOR DRIVING THE SAME, AND A DISPLAY DEVICE

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Zhiyong Xiong, Wuhan (CN); Zhao Xu, Wuhan (CN)

(73) Assignees: WUHAN TIANMA MICROELECTRONICS CO., LTD., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 17/874,718

(22) Filed: Jul. 27, 2022

(65) Prior Publication Data
US 2022/0366859 A1   Nov. 17, 2022

(30) Foreign Application Priority Data

Mar. 31, 2022 (CN) .......................... 202210337846.9

(51) Int. Cl.
*G09G 3/3291*  (2016.01)
*H10K 59/121*  (2023.01)

(52) U.S. Cl.
CPC ....... *G09G 3/3291* (2013.01); *H10K 59/1213* (2023.02); *G09G 2320/0233* (2013.01)

(58) Field of Classification Search
CPC ......... G09G 310/0262; G09G 310/061; G09G 2320/0233; G09G 310/0251;
(Continued)

(56) References Cited

U.S. PATENT DOCUMENTS

2009/0121983 A1* 5/2009 Sung ................... H10K 59/352
345/76
2014/0333214 A1* 11/2014 Okuno .................... G09G 3/32
315/172

(Continued)

FOREIGN PATENT DOCUMENTS

CN           110085646 A      8/2019

*Primary Examiner* — Shaheda A Abdin
(74) *Attorney, Agent, or Firm* — CHRISTENSEN O'CONNOR JOHNSON KINDNESS PLLC

(57) ABSTRACT

Provided are a display panel, a method for driving a display panel, and a display device. The display panel includes first pixels. The first pixel includes first and second light-emitting elements, and first and second pixel circuits respectively electrically connected to first electrodes of the first and second light-emitting elements. First electrodes of the first and second light-emitting element are independent from each other. Second electrodes of the first and second light-emitting elements are electrically connected to each other. Light-emitting material layers of the first and second light-emitting elements are formed into one piece. When the display panel displays at least one frame of an image, data voltages received by the first pixel circuit and the second pixel circuit in a same first pixel are different from each other. Thus, an influence of hysteresis effect on brightness of the first pixel is reduced to improve the display effect.

16 Claims, 12 Drawing Sheets

(58) Field of Classification Search
CPC .......... G09G 2330/08; G09G 2330/04; G09G 2300/0847; G09G 2300/0814; G09G 3/2022; G09G 3/30; G09G 2300/0408
See application file for complete search history.

(56) References Cited

U.S. PATENT DOCUMENTS

| | | | | |
|---|---|---|---|---|
| 2017/0186782 A1* | 6/2017 | Lee | .................. | H01L 27/124 |
| 2018/0226019 A1* | 8/2018 | Tong | .................. | G09G 3/3233 |
| 2018/0308412 A1* | 10/2018 | Wu | .................. | H01L 27/124 |

* cited by examiner

DISPLAY PANEL, METHOD FOR DRIVING THE SAME, AND A DISPLAY DEVICE

CROSS-REFERENCE TO RELATED DISCLOSURES

The present disclosure claims priority to Chinese Patent Disclosure No. 202210337846.9, filed on Mar. 31, 2022, the content of which is incorporated herein by reference in its entirety.

TECHNICAL FIELD

The present disclosure relates to the field of display technologies, and in particular, to a display panel, a method for driving a display panel, and a display device.

BACKGROUND

The organic light-emitting diode (OLED) display panels have the advantages of low power consumption, self-luminescence, wide viewing angle, wide temperature characteristics, and fast response speed, and are widely used in the market. The pixel driving circuit configured to control the light-emitting element to emit light is the core technology for the OLED display panel, and has important research significance.

In the pixel driving circuit in the relate art, due to the operating characteristics of the driving transistor, the hysteresis effect of the driving transistor greatly affects the pixel circuit, and the hysteresis effect of the driving transistor will cause image sticking of the display panel. Moreover, the image sticking will be more serious when the display panel displays a still image.

SUMMARY

In a first aspect, an embodiment of the present disclosure provides a display panel. The display panel includes first pixels. At least one of the first pixels each includes: a first light-emitting element and a second light-emitting element, wherein a first electrode of the first light-emitting element and a first electrode of the second light-emitting element are independent from each other; a second electrode of the first light-emitting element and a second electrode of the second light-emitting element are electrically connected to each other; and a light-emitting material layer of the first light-emitting element and a light-emitting material layer of the second light-emitting element are formed into one piece; and a first pixel circuit and a second pixel circuit, wherein the first pixel circuit is electrically connected to the first electrode of the first light-emitting element, and the second pixel circuit is electrically connected to the first electrode of the second light-emitting element. For a same one of the at least one first pixel, when the display panel displays at least one frame of an image, a data voltage received by the first pixel circuit is different from a data voltage received by the second pixel circuit.

In a second aspect, an embodiment of the present disclosure provides a method for driving a display panel. The display panel includes first pixels. At least one of the first pixels each includes: a first light-emitting element and a second light-emitting element, wherein a first electrode of the first light-emitting element and a first electrode of the second light-emitting element are independent from each other; a second electrode of the first light-emitting element and a second electrode of the second light-emitting element are electrically connected to each other; and a light-emitting material layer of the first light-emitting element and a light-emitting material layer of the second light-emitting element are formed into one piece; and a first pixel circuit and a second pixel circuit, wherein the first pixel circuit is electrically connected to the first electrode of the first light-emitting element, and the second pixel circuit is electrically connected to the first electrode of the second light-emitting element. The method includes: for a same one of the at least one first pixel, when the display panel displays at least one frame of an image, setting a data voltage received by the first pixel circuit to be different from a data voltage received by the second pixel circuit.

In a third aspect, an embodiment of the present disclosure provides a display device. The display device includes a display panel. The display panel includes first pixels. At least one of the first pixels each includes: a first light-emitting element and a second light-emitting element, wherein a first electrode of the first light-emitting element and a first electrode of the second light-emitting element are independent from each other; a second electrode of the first light-emitting element and a second electrode of the second light-emitting element are electrically connected to each other; and a light-emitting material layer of the first light-emitting element and a light-emitting material layer of the second light-emitting element are formed into one piece; and a first pixel circuit and a second pixel circuit, wherein the first pixel circuit is electrically connected to the first electrode of the first light-emitting element, and the second pixel circuit is electrically connected to the first electrode of the second light-emitting element For a same one of the at least one first pixel, when the display panel displays at least one frame of an image, a data voltage received by the first pixel circuit is different from a data voltage received by the second pixel circuit.

BRIEF DESCRIPTION OF DRAWINGS

In order to more clearly illustrate technical solutions of embodiments of the present disclosure, the accompanying drawings used in the embodiments are briefly described below. The drawings described below are merely some of the embodiments of the present disclosure. Based on these drawings, those skilled in the art can obtain other drawings according to these drawings.

DETAILED DESCRIPTION OF EM O IMENTS

In order to better illustrate technical solutions of the present disclosure, embodiments of the present disclosure are described in detail below with reference to the drawings.

It should be noted that the described embodiments are merely some of the embodiments, rather than all of the embodiments, of the present disclosure. On the basis of the embodiments of the present disclosure, all other embodiments obtained by those skilled in the art shall fall into a protection scope of the present disclosure.

The terms used in the embodiments of the present disclosure are merely for the purpose of describing particular embodiments but not intended to limit the present disclosure. Unless otherwise noted in the context, the singular form expressions "a", "an", "the" or "said" used in the embodiments and appended claims of the present disclosure are also intended to represent a plural form.

It should be understood that the term "and/or" as used herein is merely an association describing the associated object, indicating that there can be three relationships. For example, A and/or B can indicate three cases: A alone; A and B; B alone. A character "/" herein generally indicates that the contextual objects are in an "or" relationship.

In the description of this specification, it should be understood that words such as "substantially", "approximately", "about", "roughly", described in the claims and embodiments of the present disclosure indicate that, this is not a precise value but is within a reasonable technological operating range or tolerance range that is generally acceptable.

It should be understood that although the terms first, second, third, etc. can be used to describe directions, metal blocks, signal lines, and others in the embodiments of the present disclosure, these directions, metal blocks, signal lines, and others should not be limited to these terms. These terms are merely used to distinguish directions, metal blocks, signal lines, and others from each other. For example, without departing from the scope of the embodiments of the present disclosure, a first direction can also be referred to as a second direction, and similarly, a second direction can also be referred to as a first direction.

Those skilled in the art can make various modifications and variations in the present disclosure without departing from the scope of the present disclosure. Accordingly, the present disclosure is intended to cover the modifications and variations of the present disclosure that fall within the scope of corresponding claims (claimed technical solutions) and their equivalents. It should be understood that the implementation manners provided by the embodiments of the present disclosure can be combined with each other if there is no contradiction.

Figure 1:
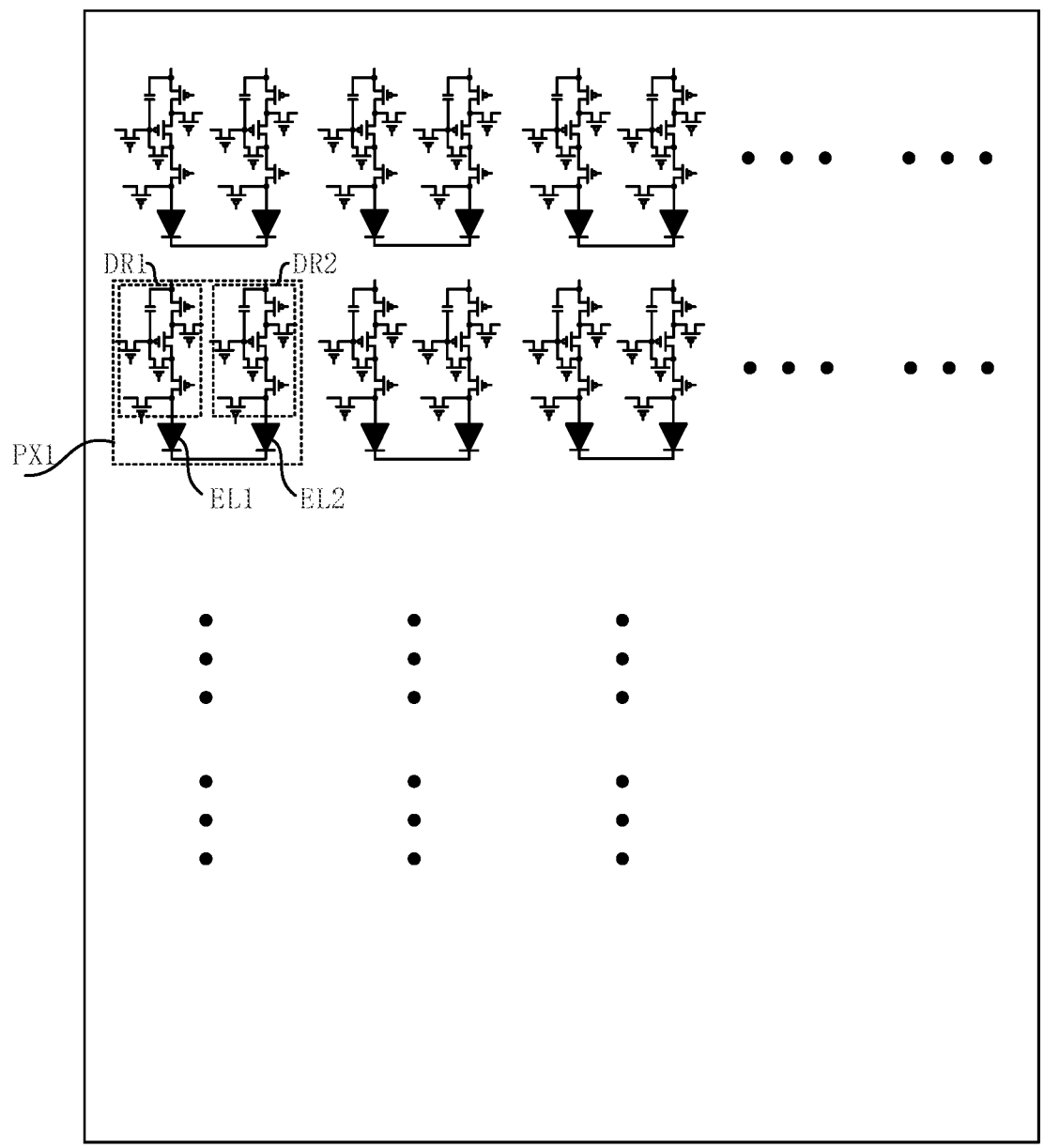
FIG. 1 is a schematic diagram of a display panel according to an embodiment of the present disclosure.
Figure 2:
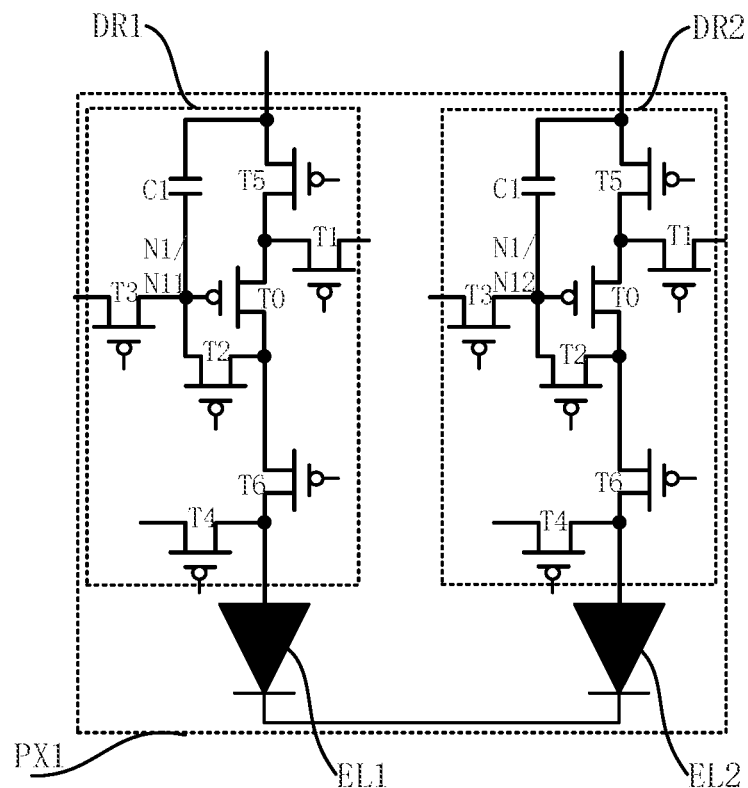
FIG. 2 is an equivalent circuit diagram of a first pixel of a display panel according to an embodiment of the present disclosure.
Figure 3:
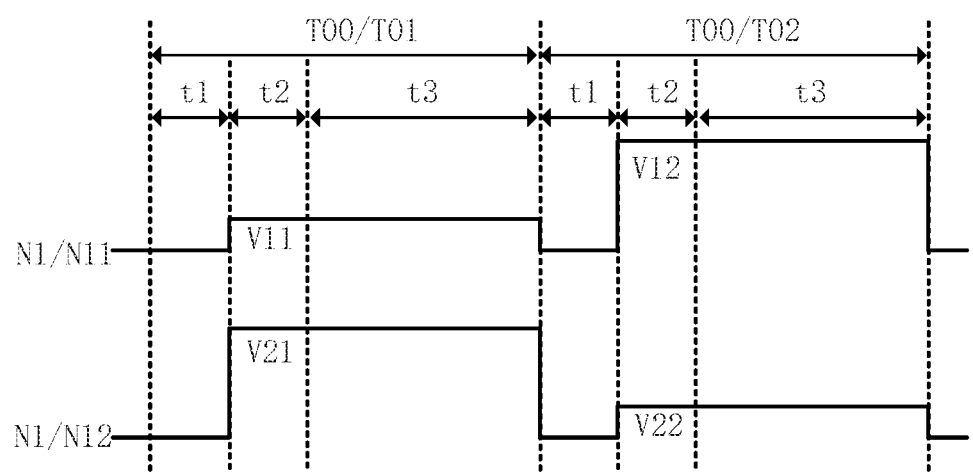
FIG. 3 is a timing sequence of the circuit shown in FIG. 2.
Figure 4:
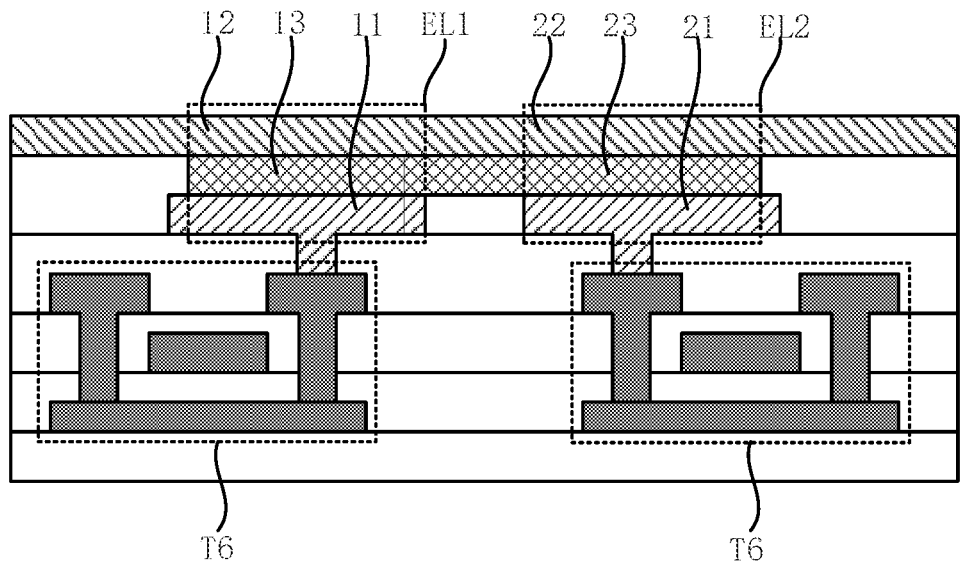
FIG. 4 is a cross-sectional view of a first pixel according to an embodiment of the present disclosure.

FIG. 1 is a schematic diagram of a display panel provided by an embodiment of the disclosure, FIG. 2 is an equivalent circuit diagram of a first pixel of a display panel according to an embodiment of the disclosure, and FIG. 3 is a timing sequence of the circuit shown in FIG. 2 FIG. 4 is a cross-sectional view of a first pixel according to an embodiment of the present disclosure.

With reference to FIG. 1, FIG. 2, and FIG. 4, an embodiment of the present disclosure provides a display panel, and the display panel includes multiple first pixels PX1. The first pixels PX1 include a first light-emitting element EL1, a second light-emitting element EL2, a first pixel circuit DR1, and a second pixel circuit DR2. The first pixel circuit DR1 is electrically connected to the first light-emitting element EL1 and configured to provide a light-emitting driving current to the first light-emitting element EL1. The second pixel circuit DR2 is electrically connected to the second light-emitting element EL2 and configured to provide a light-emitting driving current to the second light-emitting element EL2.

With reference to FIG. 4, the first light-emitting element EL1 includes a first electrode 11, a second electrode 12, and a light-emitting material layer 13 disposed between the first electrode 11 and the second electrode 12. The second light-emitting element EL2 includes a first electrode 21, a second electrode 22, and a light-emitting material layer 23 disposed between the first electrode 21 and the second electrode 22.

In a same first pixel PX1, the first electrode Ii of the first light-emitting element EL1 is independent from the first electrode 21 of the second light-emitting element EL2. In an embodiment, the first electrode 11 of the first light-emitting element EL1 is physically separated from the first electrode 21 of the second light-emitting element EL2 (that is, the first electrode 11 of the first light-emitting element EL1 and the first electrode 21 of the second light-emitting element EL2 are not formed into one piece). The first pixel circuit DR1 is electrically connected to the first electrode 11 of the first light-emitting element EL1 and is configured to provide a light-emitting driving current to the first light-emitting element EL1. The second pixel circuit DR2 is electrically connected to the first electrode 21 of the second light-emitting element EL2 and is configured to provide a light-emitting driving current to the second light-emitting element EL2. In other words, the first light-emitting element EL1 and the second light-emitting element EL2 of a same first pixel PX1 can receive light-emitting driving currents provided by different pixel circuits through their respective first electrodes.

In an embodiment, in a same first pixel PX1, the second electrode 12 of the first light-emitting element EL1 is electrically connected to the second electrode 22 of the second light-emitting element EL2, and the light-emitting material layer 13 of the first light-emitting element EL1 and the light-emitting material layer 23 of the second light-emitting element EL2 are formed into one piece (that is, being formed in a same layer).

The light-emitting material layer 13 of the first light-emitting element EL1 and the light-emitting material layer 23 of the second light-emitting element EL2 can both be organic light-emitting material layers, and the light-emitting material layer 13 of the first light-emitting element EL1 and the light-emitting material layer 23 of the second light-emitting element EL2 in a same first pixel PX1 can emit light of a same color. In an embodiment, the first electrode 11 of the first light-emitting element EL1 and the first electrode 21 of the second light-emitting element EL2 may be anodes, and the second electrode 12 of the first light-emitting element EL1 and the second electrode 22 of the second light-emitting element EL2 can be cathodes.

In the display panel provided by the embodiments of the present disclosure, in the first pixel PX1, the light-emitting brightness of the first light-emitting element EL1 and the light-emitting brightness of the second light-emitting element EL2 can be controlled by different pixel circuits, and the light-emitting brightness of the first light-emitting element EL1 and the light-emitting brightness of the second light-emitting element EL2 collectively determine the light-emitting brightness of the first pixel PX1.

With reference to FIG. 2, the first pixel circuit DR1 and the second pixel circuit DR2 each include a driving transistor T0 and a data writing transistor T1, and the data writing transistor T1 receives a data voltage and transmits the data voltage to a gate electrode of the driving transistor T0. The gate electrode of the driving transistor T0 is electrically connected to a first node N1, thus, the data writing transistor T1 receives a data voltage and writes the data voltage to the first node N1.

As shown in FIG. 2, in the first pixel circuit DR1, the first node N1 to which the gate electrode of the driving transistor T0 is electrically connected can be a first node N11, and the data writing transistor T1 receives a data voltage and then writes the data voltage to the first node N11. As shown in FIG. 2, in the second pixel circuit DR2, the first node N1 to which the gate electrode of the driving transistor T0 is electrically connected can be a first node N12, and the data writing transistor T1 receives a data voltage and then writes the data voltage to the first node N12. In this way, a potential of the first node N11 and a potential of the first node N12 can reflect the data voltage received by the first pixel circuit DR1 and the data voltage received by the second pixel circuit DR2, respectively.

With reference to FIG. 2 and FIG. 3, the first pixel circuit DR1 and the second pixel circuit DR2 each include multiple working cycles T00, and the working cycle T00 can include a reset stage t1, a data writing stage t2, and a light-emitting stage t3. In a process of displaying one frame of an image on the display panel, the first pixel circuit DR1 and the second pixel circuit DR2 of each first pixel PX1 each complete one working cycle T00.

When the display panel displays at least one frame of an image, the data voltages received by the first pixel circuit DR1 and the second pixel circuit DR2 of a same first pixel PX1 are different from each other. That is, as shown in FIG. 3, the data voltages received by the first pixel circuit DR1 and the second pixel circuit DR2 of a same first pixel PX1 during at least one working cycle T00 are different from each other.

For example, referring to FIG. 3, when the display panel displays one frame of an image, the working cycle T00 corresponding to each of the first pixel circuit DR1 and the second pixel circuit DR2 of a same first pixel PX1 is a working cycle T01. At this time, a potential V11 of the first node N11 of the first pixel circuit DR1 is different from a potential V21 of the first node N12 of the second pixel circuit DR2, that is, the data voltage received by the first pixel circuit DR1 is different from the data voltage received by the second pixel circuit DR2, which can also be understood that amplitudes of the two data voltages are different from each other.

In another example, referring to FIG. 3, when the display panel displays one frame of an image, the working cycle T00 corresponding to each of the first pixel circuit DR1 and the second pixel circuit DR2 of a same first pixel PX1 is a working cycle T02. At this time, a potential V12 of the first node N11 of the first pixel circuit DR1 is different from a potential V22 of the first node N12 of the second pixel circuit DR2, that is, the data voltage received by the first pixel circuit DR1 is different from the data voltage received by the second pixel circuit DR2, which can also be understood that amplitudes of the two data voltages are different from each other.

The light-emitting brightness of the first pixel PX1 of the display panel provided by the embodiments of the present disclosure can be jointly determined by the light-emitting driving current generated by the first pixel circuit DR1 and the light-emitting driving current generated by the second pixel circuit DR2.

Since the light-emitting driving current of the second pixel circuit DR2 can compensate the light-emitting driving current of the first pixel circuit DR1, the data voltage received by the first pixel circuit DR1 does not need to be a specific value corresponding to the light-emitting brightness in order to realize the light-emitting brightness of the first pixel PX1. High potentials and low potentials of the data voltage received by the first pixel circuit DR1 can continuously repeat. In this way, the hysteresis effect of the driving transistor T0 of the first pixel circuit DR1 can be reduced.

Since the light-emitting driving current of the first pixel circuit DR1 can compensate the light-emitting driving current of the second pixel circuit DR2, the data voltage received by the second pixel circuit DR2 does not need to be a specific value corresponding to the light-emitting brightness in order to realize the light-emitting brightness of the first pixel PX1. High potentials and low potentials of the data voltage received by the second pixel circuit DR2 can continuously repeat. In this way, the hysteresis effect of the driving transistor T1) of the second pixel circuit DR2 can be reduced.

The first pixel circuit DR1 and the second pixel circuit DR2 of the first pixel PX1 in the display panel provided by the embodiments of the present disclosure provide the light-emitting driving currents to the first light-emitting element EL1 and the second light-emitting element EL2, respectively, which can reduce an influence of the hysteresis effect of the pixel circuits on the light emitting brightness of the first pixel PX1, thereby ensuring the display effect of the display panel.

In the technical solutions of the embodiments of the present disclosure, with continuous reference to FIG. 2 and FIG. 3, at least two frames of a same image that are continuously displayed on the display panel include a first frame of the image and a second frame of the image. As shown in FIG. 3, when the display panel displays the first frame of the image, the working cycle T00 corresponding to each of the first pixel circuit DR1 and the second pixel circuit DR2 of a same first pixel PX1 is the working cycle T01: and when the display panel displays the second frame of the image, the working cycle T00 corresponding to each of the first pixel circuit DR1 and the second pixel circuit DR2 of a same first pixel PX1 is the working cycle T02.

The data voltage received by the first pixel circuit DR1 during the first frame of the image is different from the data voltage received by the first pixel circuit DR1 during the second frame of the image, and the data voltage received by the second pixel circuit DR2 during the first frame of the image is different from the data voltage received by the second pixel circuit DR2 during the second frame of the image. For example, as shown in FIG. 3, the potential VI I of the first node N11 of the first pixel circuit DR1 during the working cycle T01 does not equal to the potential V12 of the first node N11 of the first pixel circuit DR1 during working cycle T02, and the potential V21 of the first node N12 of the second pixel circuit DR2 during the working cycle T01 does not equal to the potential V22 of the first node N12 of the second pixel circuit DR2 during working cycle T02. That is, the data voltage received by the first pixel circuit DR1 during the working cycle T01 is different from the data voltage received by the first pixel circuit DR1 during the working cycle T02, and the data voltage received by the second pixel circuit DR2 during the working cycle T01 is different from the data voltage received by the second pixel circuit DR2 during the working cycle T02.

In the related art, when the display panel continuously displays a same image, the data voltage of the gate electrode of the driving transistor T0 remains unchanged, which will obviously aggravate the hysteresis effect of the driving transistor T0, thus seriously affecting the display effect of the display panel. For example, image sticking occurs.

According to the embodiments of the present disclosure, When the display panel continuously displays a same image, the potentials of the gate electrodes of the driving transistors T0 of the first pixel circuit DR1 of one first pixel PX1 during the first frame of the image and the second frame of the image are different from each other, and the potentials of the gate electrodes of the driving transistors T0 of the second pixel circuit DR2 of this first pixel PX1 during the first frame of the image and the second frame of the image are different from each other, which can alleviate the hysteresis effect of the driving transistors T0 of the first pixel circuit DR1 and the second pixel circuit DR2. In this way, the display panel provided by the embodiments of the present disclosure can display a clear still image.

Figure 5:
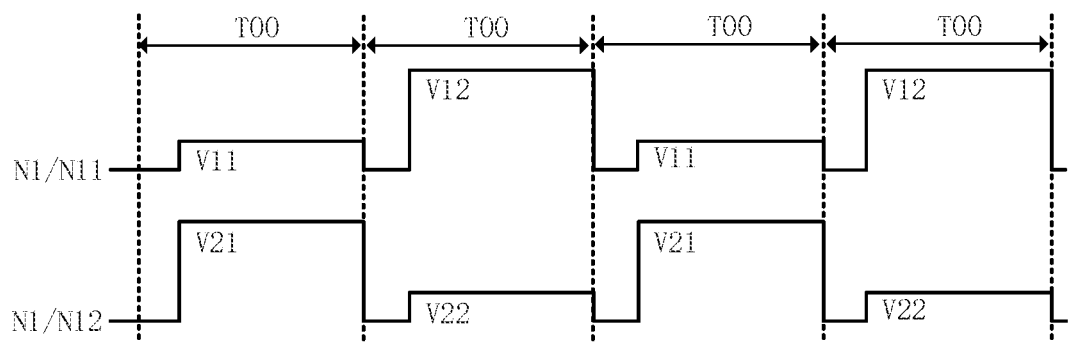
FIG. 5 is another timing sequence of the circuit shown in FIG. 2.
Figure 6:
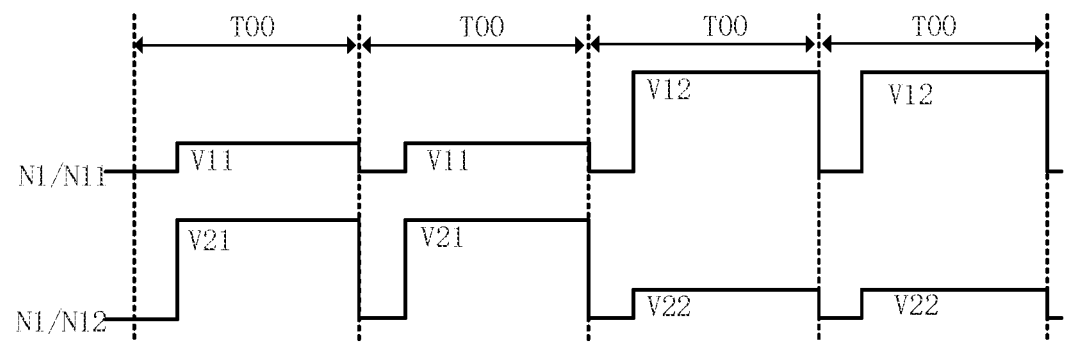
FIG. 6 is another timing sequence of the circuit shown in FIG. 2.

FIG. 5 is another timing diagram of the circuit shown in FIG. 2, and FIG. 6 is another timing diagram of the circuit shown in FIG. 2.

In an embodiment, when the display panel continuously displays multiple frames of a same image, in a same first pixel PX1, the data voltages received by the first pixel circuit DR1 during any two adjacent frames of a displayed image are different from each other, and the data voltages received by the second pixel circuit DR2 during any two adjacent frames of a displayed image are different from each other. For example, as shown in FIG. 5, in the four working cycles T00 in which the first pixel circuit DR1 and the second pixel circuit DR2 operate continuously, the potentials of the first node N11 of the first pixel circuit DR1 during odd-numbered working cycles T00 are V11, the potentials of the first node NI1 of the first pixel circuit DR1 during even-numbered working cycles T00 are V12, the potentials of the first node N12 of the second pixel circuit DR2 during odd-numbered working cycles T00 are V21, and the potentials of the first node N12 of the second pixel circuit DR2 during even-numbered working cycles T00 are V22.

In this way, the hysteresis effect of the driving transistors T0 of the first pixel circuit DR1 and the second pixel circuit DR2 in the first pixel PX1 can be alleviated, and the display effect when the display panel displays a still image can be improved, In an embodiment, when the display panel continuously displays multiple frames of a same image, in a same first pixel PX1, the data voltages received by the first pixel circuit DR1 during at least two frames of an image are different from each other, the data voltages received by the first pixel circuit DR1 during at least two adjacent frames of a displayed image are the same; and the data voltages received by the second pixel circuit DR2 during at least two frames of an image are different from each other, and the data voltages received by the second pixel circuit DR2 during at least two adjacent frames of a displayed image are the same. For example, as shown in FIG. 6, in the four working cycles T00 in which the first pixel circuit DR1 and the second pixel circuit DR2 operate continuously, the potentials of the first node N11 of the first pixel circuit DR1 during first two working cycles T00 are V11, the potentials of the first node N11 of the first pixel circuit DR1 during last two working cycles T00 are V12, the potentials of the first node N12 of the second pixel circuit DR2 during first two working cycles T00 are V21, and the potentials of the first node N12 of the second pixel circuit DR2 during last two working cycles T00 are V22.

In this way, a changing frequency of a signal on a signal line providing the data voltage for the first pixel circuit DR.1 and a changing frequency of a signal on a signal line providing the data voltage for the second pixel circuit DR2 can be reduced, thereby reducing the power consumption of the display panel.

Figure 7:
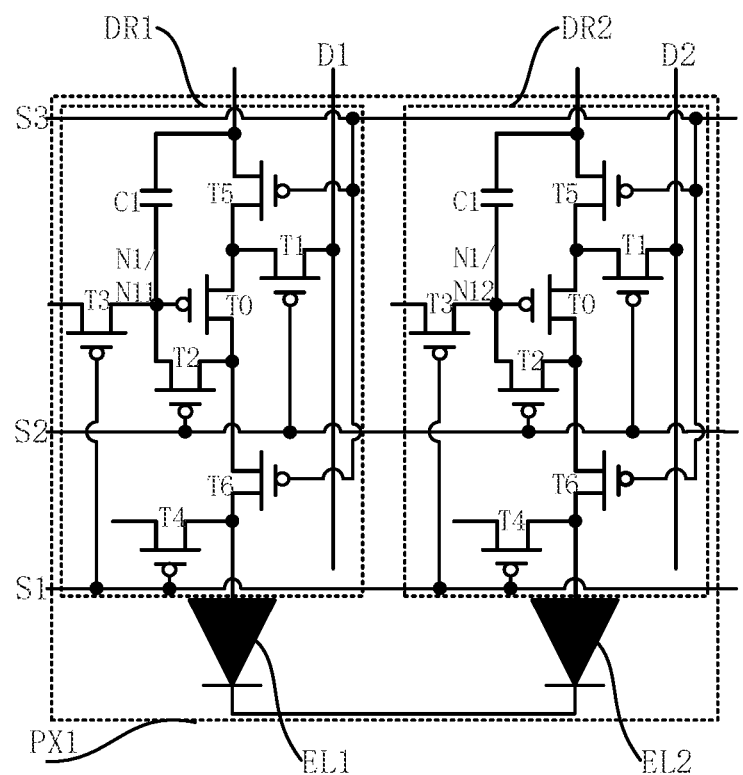
FIG. 7 is another equivalent circuit diagram of a first pixel of a display panel according to an embodiment of the present disclosure.
Figure 8:
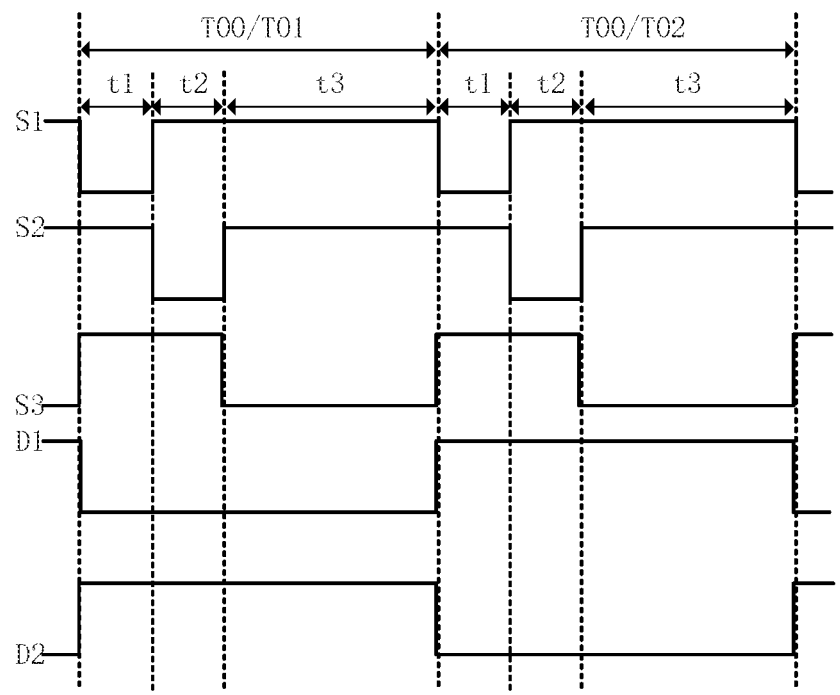
FIG. 8 is a timing sequence of the circuit shown in FIG. 7.

FIG. 7 is another equivalent circuit diagram of a first pixel of a display panel according to an embodiment of the present disclosure, and FIG. 8 is a timing diagram of the circuit shown in FIG. 7.

In the technical solutions of the embodiments of the present disclosure, referring to FIG. 7 and FIG. 8, the first pixel circuit DR1 is electrically connected to a first data line D1, and the second pixel circuit DR2 is electrically connected to a second data line D2. In this way, the first data line D1 can transmit a required data voltage to the first pixel circuit DR1, and the second data line D2 can transmit a required data voltage to the second pixel circuit DR2. 100681 When displaying a first frame of the image and a second frame of the image respectively, the first data line D1 transmits different data voltages to the first pixel circuit DR1, and the second data line D2 transmits different data voltages to the second pixel circuit DR2, That is, a data voltage transmitted by the first data line D1 to the first pixel circuit DIU during the working cycle T01 is different from a data voltage transmitted by the first data line D1 to the first pixel circuit DR1 during the working cycle T02, and a data voltage transmitted by the second data line D2 to the second pixel circuit DR2 during the working cycle T01 is different from a data voltage transmitted by the second data line D2 to the second pixel circuit DR2 during the working cycle T02.

Referring to FIG. 2 and FIG. 7. in a display panel provided by an embodiment of the present disclosure, the first pixel circuit DR1 and the second pixel circuit DR2 may each include a driving transistor T0, a data writing transistor T1, a threshold capturing transistor T2, a first reset transistor T3, a second reset transistor T4, a power supply voltage writing transistor T5, a light-emitting control transistor T6, and a storage capacitor C1. A second electrode of the data writing transistor T1 is connected to a first electrode of the driving transistor T0, a first electrode of the threshold capturing transistor T2 is connected to a second electrode of the driving transistor T0, a second electrode of the threshold capturing transistor T2 is connected to a gate electrode of the driving transistor T0, a second electrode of the power supply voltage writing transistor T5 is connected to the first electrode of the driving transistor T0, a first electrode of the light-emitting control transistor T6 is connected to the second electrode of the driving transistor T0, a second electrode of the light-emitting control transistor T6 is connected to a first electrode of a light-emitting element, a second electrode of the second reset transistor T4 is connected to the first electrode of the light-emitting element, a first electrode plate of the storage capacitor C1 is connected to a first electrode of the power supply voltage writing transistor T5, and a second electrode plate of the storage capacitor C1 is connected to the gate electrode of the driving transistor T0.

The working cycle T00 of each of the first pixel circuit DR1 and the second pixel circuit DR2 includes a reset stage t1, a data writing stage t2, and a light-emitting stage t3. During the reset stage t1, the first reset transistor T3 is turned on and transmits a reset voltage received by its first electrode to the gate electrode of the driving transistor T0 to reset the driving transistor T0, During the reset stage ti, the second reset transistor T0 T4 can also be turned on and transmit a reset voltage received by its first electrode to the first electrode of the light-emitting element. During the data writing stage t2, the data writing transistor T1 and the threshold capturing transistor T2 are turned on, and a data voltage received by the first electrode of the data writing transistor T1 is written to the gate electrode of the driving transistor T0 and stored in the storage capacitor C1. During the light-emitting stage t3, the power supply voltage writing transistor T5 and the light-emitting control transistor T0 are turned on, a first electrode of the power supply voltage writing transistor T5 receives a power supply voltage, and a light-driving current generated by the driving transistor T0 flows to the light-emitting element.

In the following, taking the driving transistor T0, the data writing transistor T1, the threshold capturing transistor T2. the first reset transistor T3, the second reset transistor T4, the power supply voltage writing transistor T5, and the light-emitting control transistor T6 each being P-channel transistors as an example, the operation process of the first pixel circuit DR1 and the second pixel circuit DR2 will be described. In an embodiment, the driving transistor T0, the data writing transistor T1, the threshold capturing transistor T2, the first reset transistor T3, the second reset transistor T4, the power supply voltage writing transistor T5, and the light-emitting control transistor T6 each can be N-channel transistors. In another embodiment, the driving transistor T0, the data writing transistor T1, the second reset transistor T4, the power supply voltage writing transistor T5, and the light-emitting control transistor T6 are all P-channel transistors, and the threshold capturing transistor T2 and the first reset transistor T3 are both N-channel transistors.

With reference to FIG. 7 and FIG. 8, the first electrode of the data writing transistor T1 of the first pixel circuit DR1 is connected to the first data line D1, and the first electrode of the data writing transistor T1 of the second pixel circuit DR2 is connected to the second data line D2. The gate electrode of the data writing transistor T1 and the gate electrode of the threshold capturing transistor T2 in the first pixel circuit DR1 and the gate electrode of the data writing transistor T1 and the gate electrode of the threshold capturing transistor T2 in the second pixel circuit DR2 can be connected to a second scanning line S2.

100731 Then, during the data writing stage t2, the second scanning line S2 transmits a low-level signal to control the data writing transistor T1 and the threshold capturing transistor T2 in the first pixel circuit DR1 to be turned on and to control the data writing transistor T1 and the threshold capturing transistor T2 in the second pixel circuit DR2 to be turned on, However, since the first electrode of the data writing transistor T1 of the first pixel circuit DR1 and the first electrode of the data writing transistor T1 of the second pixel circuit DR2 are connected to the first data line D1 and the second data line D2, respectively, the first pixel circuit DR1 and the second pixel circuit DR2 can receive different data voltages in a same working cycle T00.

Referring to FIG. 7 and FIG. 8, in an embodiment, the first electrode of the first reset transistor T3 and the first electrode of the second reset transistor T4 in the first pixel circuit DR1 are both connected to the reset signal line, and the first electrode of the first reset transistor T3 and the first electrode of the second reset transistor T4 in the second pixel circuit DR2 are both connected to the reset signal line; the gate electrode of the first reset transistor T3 and the gate electrode of the second reset transistor T4 in the first pixel circuit DR1 and the gate electrode of the first reset transistor T3 and the gate electrode of the second reset transistor T4 in the second pixel circuit DR2 are all connected to a first scanning line S1.

During the reset stage t1, the first scanning line S1 transmits a low-level signal to control the first reset transistor 13 and the second reset transistor T4 in the first pixel circuit DR1 to be turned on and to control the first reset transistor T3 and the second reset transistor T4 in the second pixel circuit DR2 to be turned on. At this time, the second scanning line S2 transmits a high-level signal, so that the data writing transistor T1 in the first pixel circuit DR1 and the data writing transistor T1 in the second pixel circuit DR2 are both turned off. Therefore, the first data line D1 and the second data line D2 can respectively transmit the data voltages required by the first pixel circuit DR1 and the second pixel circuit DR2 during the working cycle TDO without affecting reset of the first reset transistor T3 and reset of the second reset transistor T4.

It should be noted that the first electrode of the first reset transistor T3 and the first electrode of the second reset transistor T4 can be connected to different reset signal lines, respectively, and the gate electrode of the first reset transistor T3 and the gate electrode of the second reset transistor 14 can be connected to different reset signal lines, respectively. In this case, the first reset transistor T3 resets the gate electrode of the driving transistor T0 during the reset stage ti, and the second reset transistor T4 can reset the first electrode of the light emitting element during the data writing stage t2, With reference to FIG. 7 and FIG. 8, the gate electrode of the power supply voltage writing transistor 15 of the first pixel circuit MI, the gate electrode of the light-emitting control transistor T6 of the first pixel circuit DR , the gate electrode of the power supply voltage writing transistor T5 of the second pixel circuit DR2, and the gate electrode of the light-emitting control transistors T6 of the second pixel circuit DR2 are all connected to a light-emitting control line S3.

Then, during the light-emitting stage t3, the light-emitting control line S3 transmits a low-level signal to control the power supply voltage writing transistor 15 and the light-emitting control transistor T6 in the first pixel circuit DR1 to be turned on and to control the power supply voltage writing transistor T5 and the light-emitting control transistor 16 in the second pixel circuit DR2 to be turned on. At this time, the second scanning line S2 transmits a high-level signal, so that the data writing transistor T1 in the first pixel circuit DR1 and the data writing transistor T1 in the second pixel circuit DR2 are both turned off. Therefore, the first data line D1 and the second data line D2 can respectively transmit the data voltage required by the first pixel circuit DR1 and the data voltage required by the second pixel circuit DR2 during the working cycle T00 without affecting generation and transmission of the light-emitting driving current.

In the display panel provided by the embodiments of the present disclosure, different data voltages can be transmitted to different pixel circuits in a same first pixel PX1 through the first data line D1 and the second data line D2, respectively, thereby avoiding that the first pixel circuit DR1 and the second pixel circuit DR2 in a same first pixel PX1 share a same data line, that is, avoiding increase of the power of the display panel caused by increasing a changing frequency of a voltage of the data line, or, that is, avoiding decrease of a refresh rate of the display panel caused by lengthening the period for the data voltage to be written to the pixel circuit.

In the technical solutions of the embodiments of the present disclosure, the first pixel circuit DR1 and the second pixel circuit DR2 in a same first pixel PX1 are connected to a same light-emitting control line.

With reference to FIG. 7 and FIG. 8, in a same first pixel PX1, the gate electrode of the power supply voltage writing transistor T5 of the first pixel circuit DR1, the gate electrode of the light-emitting control transistor T6 of the first pixel circuit DR1 the gate electrode of the power supply voltage writing transistor T5 of the second pixel circuit DR2, the gate electrode of the light-emitting control transistor T6 of the second pixel circuit DR2 are connected to the light-emitting control line S3. During the light-emitting stage T2, the signal transmitted by the light-emitting control line S3 controls the power supply voltage writing transistor T5 of the first pixel circuit DR1, the light-emitting control transistor T6 of the first pixel circuit DR1, and the power supply voltage writing transistor T5 of the second pixel circuit DR2, and the light-emitting control transistor T6 of the second pixel circuit DR2 to be turned on.

Figure 9:
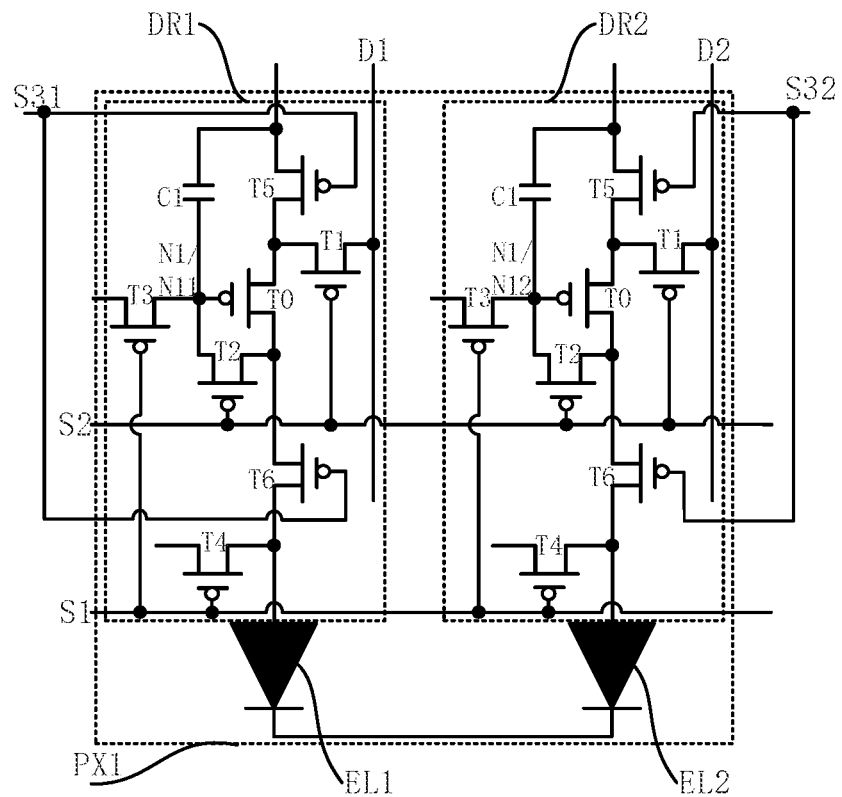
FIG. 9 is another equivalent circuit diagram of a first pixel of a display panel provided by an embodiment of the present disclosure.
Figure 10:
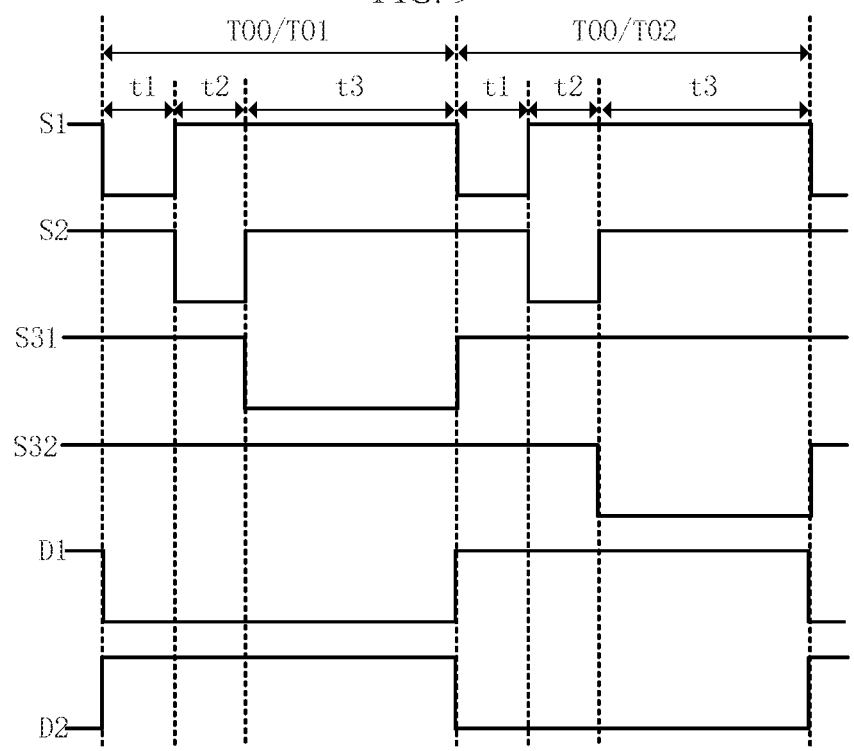
FIG. 10 is a timing sequence of the circuit shown in FIG. 9.

FIG. 9 is another equivalent circuit diagram of a first pixel in a display panel provided by an embodiment of the present disclosure, and FIG. 10 is a timing diagram of the circuit shown in FIG. 9.

In the technical solutions of the embodiments of the present disclosure, the first pixel circuit DR1 is connected to a first light-emitting control line S31, and the second pixel circuit DR2 is connected to a second light-emitting control line S32. With reference to FIG. 9 and FIG. 10, in a same first pixel PX1, the gate electrode of the power supply voltage writing transistor T5 and the gate electrode of the light-emitting control transistor T6 in the first pixel circuit DR1 are connected to the first light-emitting control line S31, and the gate electrode of the power supply voltage writing transistor T5 and the gate electrode of the light-emitting control transistor T6 in the second pixel circuit DR2 are connected to the second light-emitting control line S32.

At least two frames of a same image continuously displayed on the display panel include a first frame of the image and a second frame of the image.

Then, when displaying the first frame of the image, the first light-emitting control line S31 transmits a control signal to the first pixel circuit DR1, so that the power supply voltage writing transistor 15 and the light-emitting control transistor T6 in the first pixel circuit DR1 are both turned on, and then the first pixel circuit DR1 can provide a light-emitting driving current to the first light-emitting element EL1. At this time, the second light-emitting control line S32 can transmit a control signal to the second pixel circuit DR2 so that both the power supply voltage writing transistor T5 and the light-emitting control transistor 16 in the second pixel circuit DR2 are turned off, and then the second pixel circuit DR2 does not provide a light-emitting driving current to the second light-emitting element EL2.

When displaying the second frame of the image, the second light-emitting control line S32 transmits a control signal to the second pixel circuit DR2, so that the power supply voltage writing transistor T5 and the light-emitting control transistor 16 in the second pixel circuit DR2 are both turned on, and then the second pixel circuit DR2 can provide a light-emitting driving current to the second light-emitting element EL2. At this time, the first light-emitting control line S31 can transmit a control signal to the first pixel circuit DR1. so that both the power supply voltage writing transistor T5 and the light-emitting control transistor 16 in the first pixel circuit DR1 are turned off, and then the first pixel circuit DR1 does not provide a light-emitting driving current to the first light-emitting element EL1.

In the technical solutions of the embodiments of the present disclosure, as shown in FIG. 8 and FIG. 10, when the display panel displays the first frame of the image, that is, during the working cycle T01 of the first pixel circuit DR1 and the second pixel circuit DR2, the data voltage transmitted by the data line D1 to the first pixel circuit DR1 is smaller than the data voltage transmitted by the second data line D2 to the second pixel circuit DR2; and when the display panel displays the second frame of the image, that is, during the working cycle T02 of the first pixel circuit DR1 and the second pixel circuit DR2, the data voltage transmitted by the first data line D1 to the first pixel circuit DR1 is greater than the data voltage transmitted by the second data line D2 to the second pixel circuit DR2.

That is, in the embodiments of the present disclosure, data voltages of different potentials are transmitted to the first pixel circuit DRI and the second pixel circuit DR2 in the first pixel PX1 through different data lines, so that different pixel circuits in the first pixel PX1 can respectively receive data voltages transmitted by different data lines, thereby increasing the flexibility of data voltages received by different pixel circuits in the first pixel circuit PX1.

In an embodiment, when the display panel displays the first frame of the image, that is, during the working cycle T01 of the first pixel circuit DR1 and the second pixel circuit DR2, the first data line D1 transmits a bright-state data voltage to the first pixel circuit DR1 and the second data line D2 transmits a dark-state data voltage to the second pixel circuit DR2; and when displaying the second frame of the image, that is, during the working cycle T02 of the first pixel circuit DR1 and the second pixel circuit DR2, the first data line D1 transmits a dark-state data voltage to the first pixel circuit DR1, and the second data line D2 transmits a bright-state data voltage to the second pixel circuit DR2.

Then, during the working cycle T01, the potential V11 of the gate electrode of the driving transistor T0 of the first pixel circuit DR1 causes the driving transistor T0 to generate a light-emitting driving current that controls the first light-emitting element EL1 to emit light, and the potential V21 of the gate electrode of the driving transistor T0 of the second pixel circuit DR2 causes the driving transistor T0 to not generate a light-emitting driving current that controls the second light-emitting element EL2 to emit light. During the working cycle T02, the potential V12 of the gate electrode of the driving transistor T0 of the first pixel circuit DR1 causes the driving transistor T0 to not generate a light-emitting driving current that controls the first light-emitting element EL1 to emit light, and the potential V22 of the gate electrode of the driving transistor T0 of the second pixel circuit DR2 causes the second light-emitting element EL2 to generate a light-emitting driving current that controls the second light-emitting element EL2 to emit light.

In an embodiment, when the display panel displays the first frame of the image, that is, during the working cycle T01 of the first pixel circuit DR1 and the second pixel circuit DR2, the first data line D1 and the second data line D2 transmit bright-state data voltages to the first pixel circuit DR1 and the second pixel circuit DR2, respectively; and when displaying the second frame of the image, that is, during the working cycle T02 of the first pixel circuit DR1 and the second pixel circuit DR2, the first data line D1 and the second data line D2 transmit bright-state data voltages to the first pixel circuit DR1 and the second pixel circuit DR2, respectively.

Then, during the working cycle T01, the potential V11 of the gate electrode of the driving transistor T0 of the first pixel circuit DR1 causes the driving transistor T0 to generate a light-emitting driving current that controls the first element EL1 to emit light, and the potential V21 of the gate electrode of the driving transistor T0 of the second pixel circuit DR2 causes the driving transistor T0 to generate a light-emitting driving current that controls the second light-emitting element EL2 to emit light, where V11≠V21. During the working cycle T02, the potential V12 of the gate electrode of the driving transistor T0 of the first pixel circuit DR1 causes the driving transistor T0 to generate a light-emitting driving current that controls the first light-emitting element EL1 to emit light, and the potential V22 of the gate electrode of the driving transistor T0 of the second pixel circuit DR2 causes the driving transistor to generate a light-emitting driving current that controls the second light-emitting element EL2 to emit light, where V12≠V22.

In an embodiment, the first frame of the image and the second frame of the image are displayed continuously, that is, the working cycle T01 and the working cycle T02 of the first pixel circuit DR1 and the second pixel circuit DR2 are performed continuously. It can be illustrated as that, when the display panel continuously displays multiple frames of a same image, the first pixel circuit DR1 alternately receives a high-level data voltage and a low-level data voltage, and the second pixel circuit DR2 alternately receives a low-level data voltage and a high-level data voltage.

Figure 11:
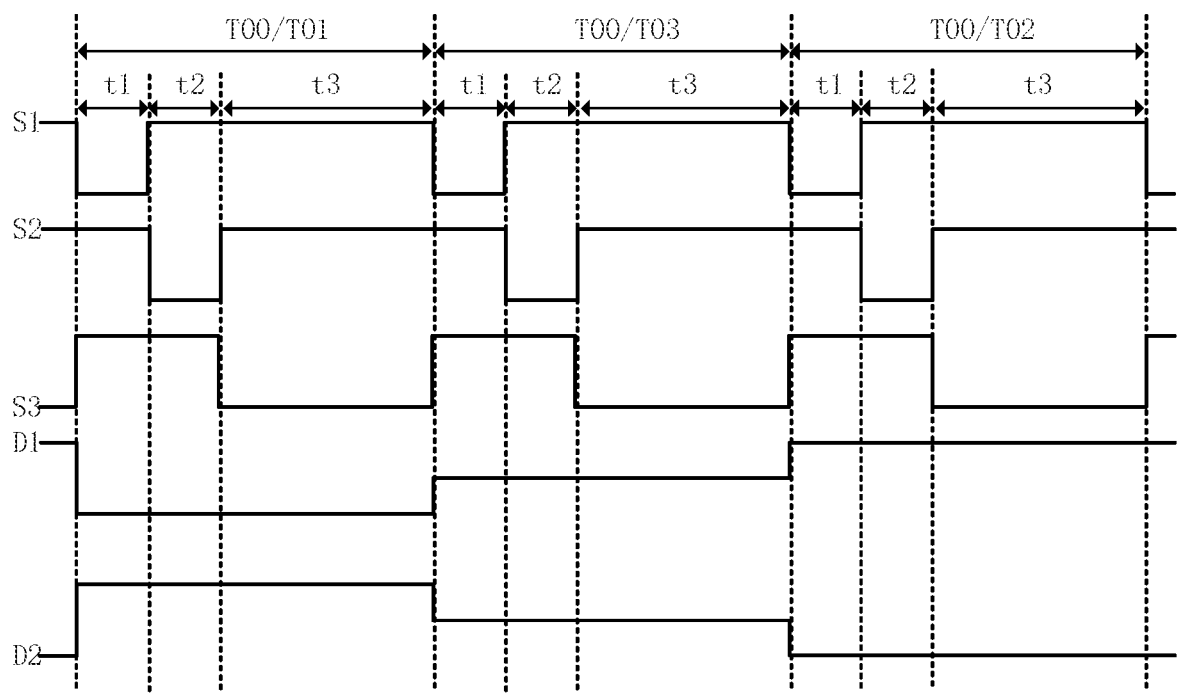
FIG. 11 is another timing sequence of the circuit shown in FIG. 7.

FIG. 11 is another timing diagram of the circuit shown in FIG. 7.

In an embodiment, as shown in FIG. 11, at least two frames of a same image continuously displayed on the display panel further include a third frame of the image, and the third frame of the image is displayed between the first frame of the image and the second frame of the image. That is, the working cycle T0 of each of the first pixel circuit DR1 and the second pixel circuit DR2 includes a working cycle T03, and when the display panel displays the third frame of the image, the first pixel circuit DR1 and the second pixel circuit DR2 operates during the working cycle T03, and the working cycle T03 is between the working cycle T01 and the working cycle T02.

When the display panel sequentially displays the first frame of the image, the third frame of the image, and the second frame of the image, the data voltages transmitted from the first data line D1 to the first pixel circuit DR1 gradually increase, and the data voltages transmitted from the second data line D2 to the second pixel circuit DR2 gradually decrease. That is, during the working cycle T01, the working cycle T03, and the working cycle T02 that are performed in sequence, the data voltages received by the first pixel circuit DR1 gradually increase, and the data voltages received by the second pixel circuit DR2 gradually decrease.

Further, when displaying the first frame of the image, that is, during the working cycle ml of the first pixel circuit DR and the second pixel circuit DR2, the first data line D1 transmits a bright-state data voltage to the first pixel circuit DR1, and the second data line D2 transmits a dark-state data voltage to the second pixel circuit DR2 and when displaying the second frame of the image, that is, during the working cycle T02 of the first pixel circuit DR1 and the second pixel circuit DR2, the first data line D1 transmits a dark-state data voltage to the first pixel circuit DR1, and the second data line D2 transmits a bright-state data voltage to the second pixel circuit DR2. When displaying the third frame of the image, that is, during the working cycle T03 of the first pixel circuit DR1 and the second pixel circuit DR2, the first data line D1 transmits a bright-state data voltage to the first pixel circuit DR1, and the second data line D2 transmits a bright-state data voltage to the second pixel circuit DR2.

Then, during the working cycle T01 the potential V11 of the gate electrode of the driving transistor T0 of the first pixel circuit DR1 causes the driving transistor T0 to generate a light-emitting driving current that controls the first light-emitting element EL1 to emit light, and the potential V21 of the gate electrode of the driving transistor T0 of the second pixel circuit DR2 causes the driving transistor to not generate a light-emitting driving current that controls the second light-emitting element EL2 to emit light. During the working cycle102, the potential V12 of the gate electrode of the driving transistor T0 of the first pixel circuit DR1 cause the driving transistor T0 to not generate a light-emitting driving current that controls the first light-emitting element EL1 to emit light, and the potential V22 of the gate electrode of the driving transistor T0 of the second pixel circuit DR2 causes the driving transistor to generate a light-emitting driving current that controls the second light-emitting element EL2 to emit light. During the working cycle T03, the potential of the gate electrode of the driving transistor T0 of the first pixel circuit DR1 causes the driving transistor T0 to generate a light-emitting driving current that controls the first light-emitting element EL1 to emit light, and the potential of the gate electrode of the driving transistor T0 of the second pixel circuit DR2 causes the driving transistor to generate a light-emitting driving current that controls the second light-emitting element EL2 to emit light.

Figure 12:
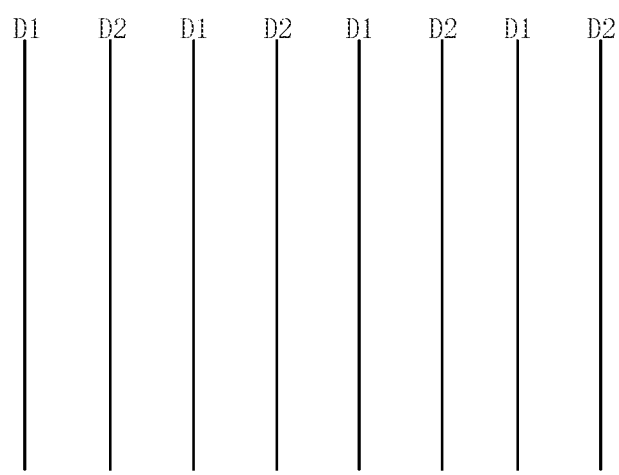
FIG. 12 is a schematic diagram of an arrangement of data lines of a display panel according to an embodiment of the present disclosure.
Figure 13:
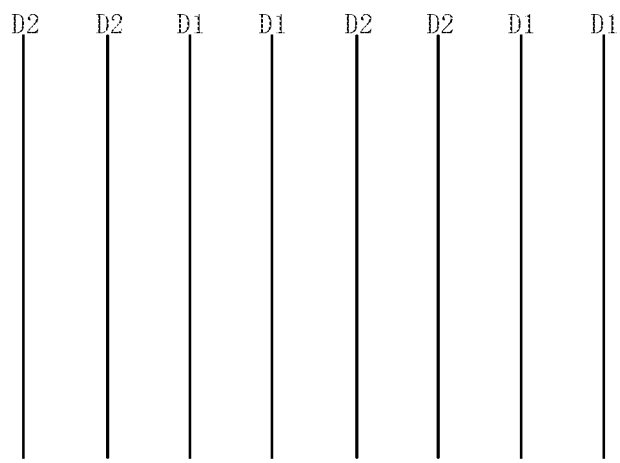
FIG. 13 is a schematic diagram of another arrangement of data lines of a display panel according to an embodiment of the present disclosure.

FIG. 12 is a schematic diagram of an arrangement of data lines of a display panel according to an embodiment of the present disclosure, and FIG. 13 is a schematic diagram of another arrangement of data lines of a display panel according to an embodiment of the present disclosure.

In the technical solution of an embodiment of the present disclosure, as shown in FIG. 12, the first data lines D1 and the second data lines D2 are alternated arranged.

In the technical solution of an embodiment of the present disclosure, as shown in FIG. 13, two second data lines D2 are arranged between two adjacent first data lines D1, and two adjacent first data lines D1 are arranged between two adjacent second data lines D2.

Figure 14:
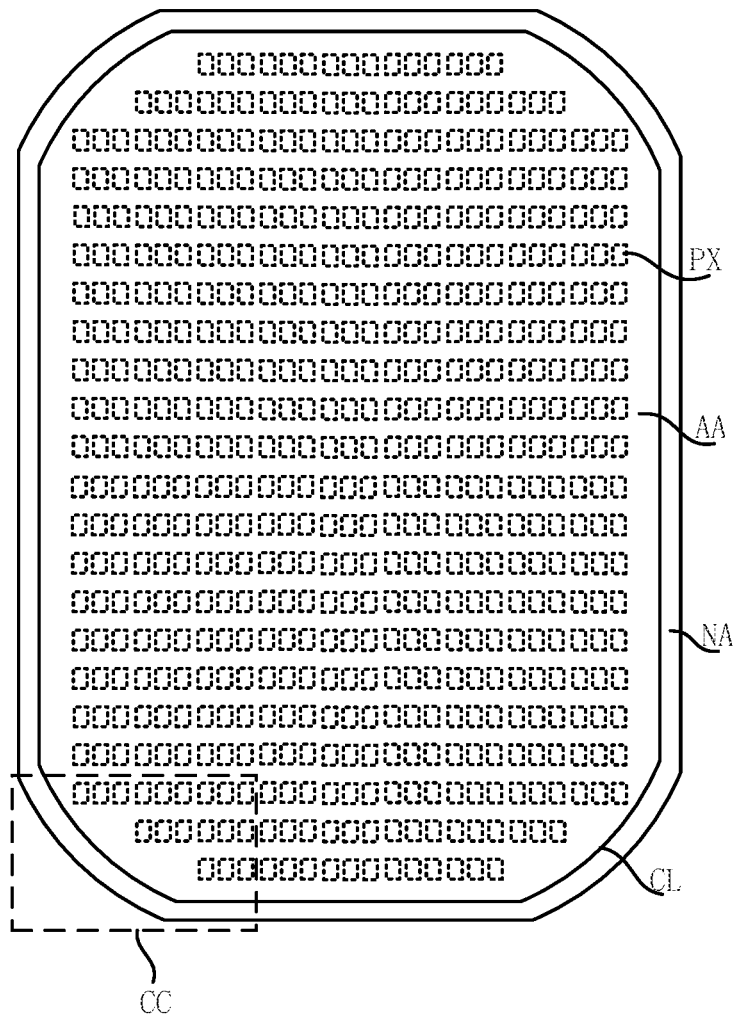
FIG. 14 is another schematic diagram of a display panel according to an embodiment of the present disclosure.
Figure 15:
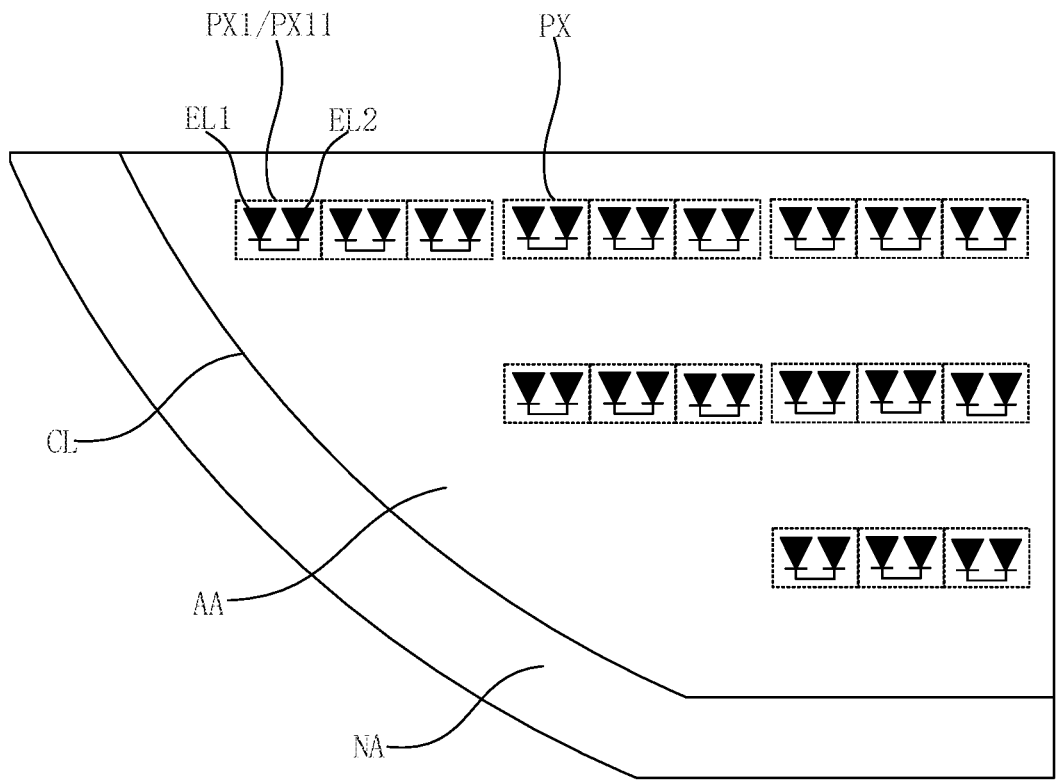
FIG. 15 is a partial enlarged view of a CC region in FIG. 14.
Figure 16:
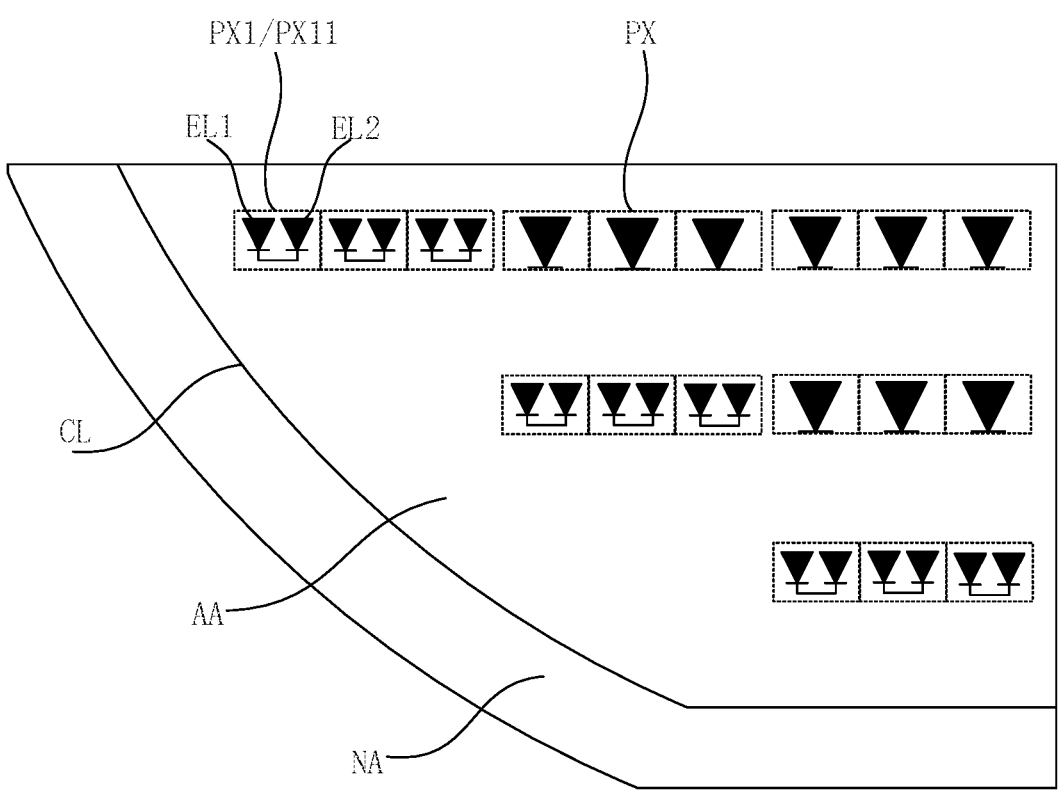
FIG. 16 is another partial enlarged view of a CC region in FIG. 14.
Figure 17:
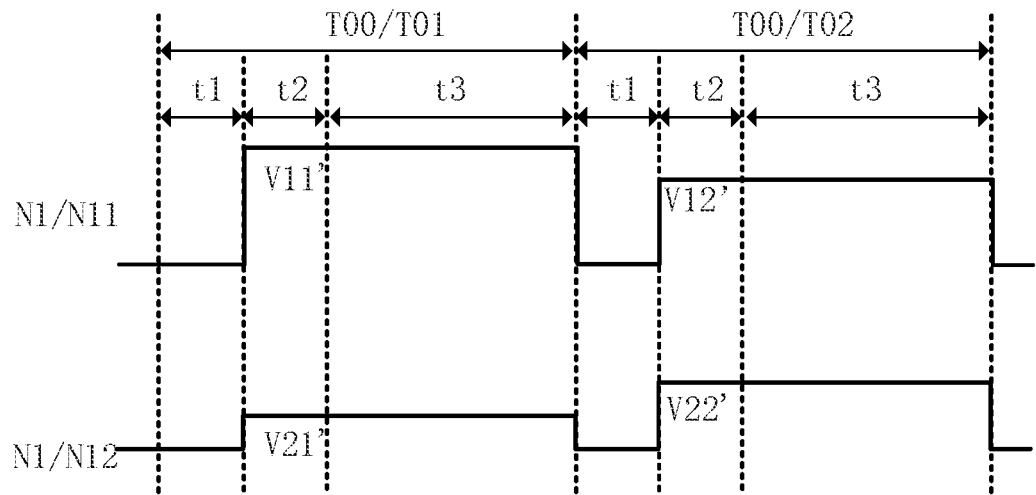
FIG. 17 is a timing sequence of a first pixel circuit and a second pixel circuit in a first sub-pixel.

FIG. 14 is another schematic diagram of a display panel according to an embodiment of the present disclosure, FIG. 15 is a partial enlarged schematic diagram of a CC area in FIG. 14, FIG. 16 is another partial enlarged schematic diagram of a CC area in FIG. 14, and FIG. 17 is a timing sequence of the first pixel circuit and the second pixel circuit of the first sub-pixel.

As shown in FIG. 14, the display panel has a display area AA and anon-display area NA, and the non-display area NA can surround the display area AA. The display area AA includes a chamfer CL, that is, an outer contour of the display area AA is in a non-rectangular shape.

With reference to FIG. 14, FIG. 15, and FIG. 16, multiple pixels PX are arranged in the display area AA. and at least one of the multiple pixels PX is the first pixel PX1. The first pixel PX1 includes the first sub-pixel PX11 adjacent to the chamfer, that is, at least one first pixel PX1 is close to the chamfer CL. and the at least one first pixel PX1 is the first sub-pixel PX11 close to the chamfer CL. That is, the first sub-pixel PX11 is the first pixel PX1 of the multiple first pixels PX1 that is close to the chamfer CL.

As shown in FIG. 15 and FIG. 16, in the first sub-pixel PX11, the first light-emitting element EL1 is closer to the chamfer CL than the second light-emitting element EL2. When displaying a frame of an image, the data voltage received by the first pixel circuit DR1 in the first sub-pixel PX11 is greater than the data voltage received by the second pixel circuit DR2 in the first sub-pixel PX11, and thus in the first sub-pixel PX11, the brightness of the first light-emitting element EL1 that is close to the chamfer CL is lower than the brightness of the second light-emitting element EL2 that is far away from the chamfer CL, thereby alleviating displaying sawtooth at the chamfer when emitting light.

Referring to FIG. 2 and FIG. 17, during the working cycle T01, the potential of the data voltage V11' received by the first node N11 of the first pixel circuit DR1 in the first sub-pixel PX11 is greater than the potential of the data voltage V21' received by the first node N12 of the second pixel circuit DR1; and during the working cycle T02, the potential of the data voltage V12' received by the first node N11 of the first pixel circuit DR1 in the first sub-pixel PX11 is greater than the data voltage V22' received by the first node N12 of the second pixel circuit DR1.

In an embodiment, as shown in FIG. 17, V11'≠V21', and V12'≠ V21'. That is, when the display panel displays at least one frame of an image, in a same first sub-pixel PX11, the data voltage received by the first pixel circuit DR1 is different from the data voltage received by the second pixel circuit DR2.

In the display panel provided by this embodiment, the pixel close to the chamfer CL is the first sub-pixel PX11 including the first light-emitting element EL1 and the second light-emitting element EL2, in this case, although the first light-emitting element EL1 has a low brightness, the second light-emitting element EL2 can compensate the light-emitting brightness of the first sub-pixel PX11, thereby ensuring that the display panel still has a high light-emitting brightness at the chamfer, and thus improving the brightness uniformity of the display panel.

It should be noted that, at least three pixels PX of different colors form a light-emitting unit, thus, the light-emitting unit close to the chamfer CL also includes at least three pixels PX of different colors. In order to achieve a white balance at the chamfer CL of the display panel, each pixel PX in the light emitting unit close to the chamfer CL of the display panel can include a first light-emitting element EL1 and a second light-emitting element EL2, and the light-emitting brightness of the first light-emitting element EL1 close to chamfer CL is smaller than the light-emitting brightness of the second light-emitting element EL2 far away from the chamfer CL. That is, each pixel PX of the light emitting unit close to the chamfer CL of the display panel is the first sub-pixels PX11.

In an embodiment, as shown in FIG. 15, other pixels PX far away from the chamfer CL are all first pixels PX1, that is, all pixels PX in the display panel are all first pixels PX1.

In an embodiment, as shown in FIG. 16, at least one of other pixels PX far away from the chamfer CL includes only one light-emitting element.

Figure 18:
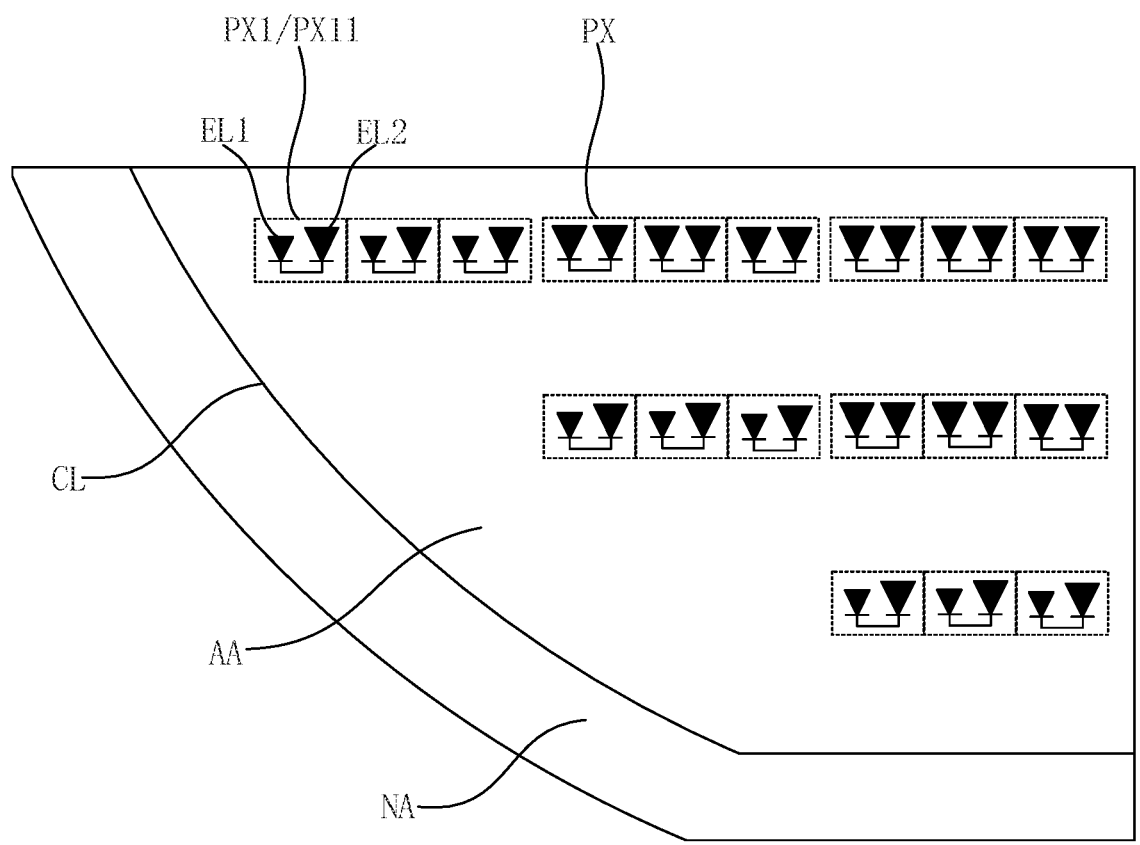
FIG. 18 is another partial enlarged schematic view of a CC region in FIG. 14.

FIG. 18 is another partial enlarged schematic view of the CC region in FIG. 14.

In the technical solution of an embodiment of the present disclosure, as shown in FIG. 18, in the first sub-pixel PX11, an area of the first light-emitting element EL1 is smaller than an area of the second light-emitting element EL2. By reducing the light-emitting area of the first light-emitting element EL1 of the first sub-pixel PX11 that is close to the chamfer CL, the light-emitting brightness of the first light-emitting element EL1 can be reduced, then the data voltage received by the first pixel circuit DR1 of the first sub-pixel PX11, which is higher than the data voltage received by the second pixel circuit DR2, does not need to be too large to alleviate the displaying sawtooth at the chamfer CL, thereby saving the power consumption of the display panel.

Figure 19:
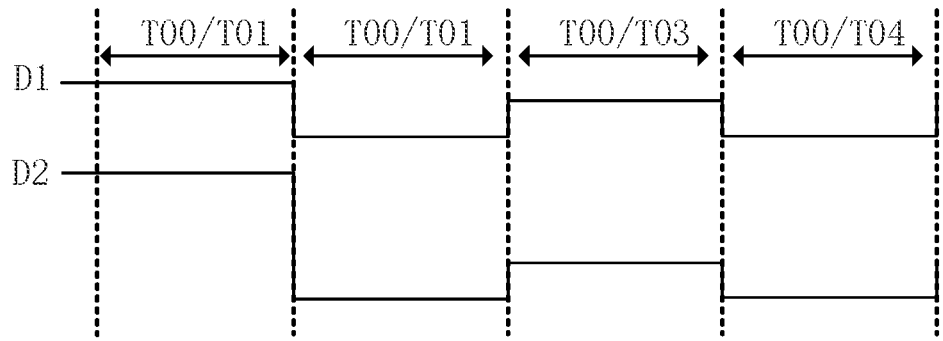
FIG. 19 is a timing sequence of a first pixel circuit and a second pixel circuit in a first sub-pixel.

FIG. 19 is a timing sequence of a first pixel circuit and a second pixel circuit in a first sub-pixel.

In the technical solutions of the embodiments of the present disclosure, with reference to FIG. 7, FIG. 9, and FIG. 19, the first pixel circuit DR1 is electrically connected to the first data line D1, and the second pixel circuit DR2 is electrically connected to the second data line D2. In a same first sub-pixel PX11, when the display panel displays a frame of an image, the data voltage transmitted from the first data line D1 to the first pixel circuit DR1 is greater than the data voltage transmitted from the second data line D2 to the second pixel circuit DR2.

That is, during any working cycle T00, in a same first sub-pixel PX11, the data voltage received by the first pixel circuit DR1 from the first data line D1 is greater than or equal to the data voltage received by the second pixel circuit DR2 from the second data line D2.

For example, as shown in FIG. 19, during the working cycle T01, the first data line D1 and the second data line D2 transmit dark-state data voltages to the first pixel circuit DR1 and the second pixel circuit DR2, respectively, and the data voltage transmitted from the first data line D1 to the first pixel circuit DR1 is equal to the data voltage transmitted from the second data line D2 to the second pixel circuit DR2. During the working cycles T02, T03, and T04, the first data line D1 and the second data line D2 transmit bright-state data voltages to the first pixel circuit DR1 and the second pixel circuit DR2, respectively, and the data voltage transmitted from the first data line D1 to the first pixel circuit DR1 is greater than the data voltage transmitted from the second data line D2 to the second pixel circuit DR2.

Figure 20:
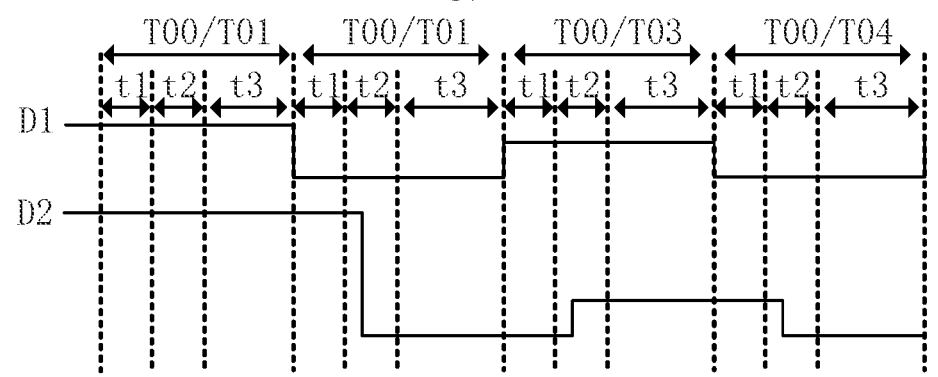
FIG. 20 is another timing sequence of a first pixel circuit and a second pixel circuit in a first sub-pixel.

FIG. 20 is another timing sequence of a first pixel circuit and a second pixel circuit in a first sub-pixel, In the technical solutions of the embodiments of the present disclosure, with reference to FIG. 7, FIG. 9. and FIG.

20, the first pixel circuit DR1 is electrically connected to the first data line D1, and the second pixel circuit DR2 is electrically connected to the second data line D2. In a same first sub-pixel PX 1, when the display panel displays a frame of an image, a period for the first data line D1 to transmit the data voltage to the first pixel circuit DR1 is longer than a period for the second data line DR2 to transmit the data voltage to the second pixel circuit DR2. In this case, the data voltage received by the gate electrode of the driving transistor T0 of the first pixel circuit DR1 is closer to a preset value, thereby alleviating the sawtooth.

That is, during the data writing stage t2 of any working cycle T00, a moment when the first pixel circuit DR1 in the first sub-pixel PX11 receives a corresponding data voltage transmitted by the first data line D1 is earlier than a moment when the second pixel circuit DR2 in the first sub-pixel PX11 receives a corresponding data voltage transmitted by the second data line D2. The corresponding data voltage is a data voltage corresponding to brightness of the frame of the image corresponding to the working cycle T00.

In the technical solutions of the present disclosure, by adjusting moments when the first data line D1 and the second data line D2 respectively start to transmit the corresponding data voltages, the period for the first data line D1 to transmit the data voltage to the first pixel circuit DR1 is longer than the period for the second data line D2 to transmit the data voltage to the second pixel circuit DR2.

For example, as shown in FIG. 20, during the working cycle T01, the first data line D1 and the second data line D2 transmit dark-state data voltages to the first pixel circuit DR1 and the second pixel circuit DR2, respectively; and during the working cycles T02, T03 and T04, the first data line D1 and the second data line D2 transmit bright-state data voltages to the first pixel circuit DR1 and the second pixel circuit DR2, respectively. During the data writing stage t2 of each of the working cycles T02, T03, and T04, the moment when the first data line DI transmits a corresponding data voltage to the first pixel circuit DR1 is earlier than the moment when the second data line D2 transmits a corresponding data voltage to the second pixel circuit DR2, and the period for the first data line D1 to transmit a corresponding data voltage to the first pixel circuit DR1. is longer than the period for the second data line D1 to transmit a corresponding data voltage to the second pixel circuit DR.2, FIG. 21 is another equivalent circuit diagram of a first pixel of a display panel provided by an embodiment of the present disclosure, and FIG. 22 is a timing diagram of a circuit shown in FIG. 21.

In the technical solutions of the embodiments of the present disclosure, the first pixel circuit DR1 and the second pixel circuit DR2 each include a driving transistor T0 and a data writing transistor T1, and the data writing transistor T1 is configured to write a data voltage to the gate electrode of the driving transistor T0. In a same first sub-pixel PX11, when the display panel displays a frame of an image, a period for the data writing transistor T1 of the first pixel circuit DR1 to transmit a data voltage to the gate electrode of the driving transistor T0 is longer than a period for the data writing transistor T1 of the second pixel circuit DR2 to transmit a data voltage to the gate electrode of the driving transistor T0 of the second pixel circuit DR2. In this case, the data voltage received by the gate electrode of the driving transistor T0 of the first pixel circuit DR1 is closer to a preset value, thereby alleviating the sawtooth.

Figure 21:
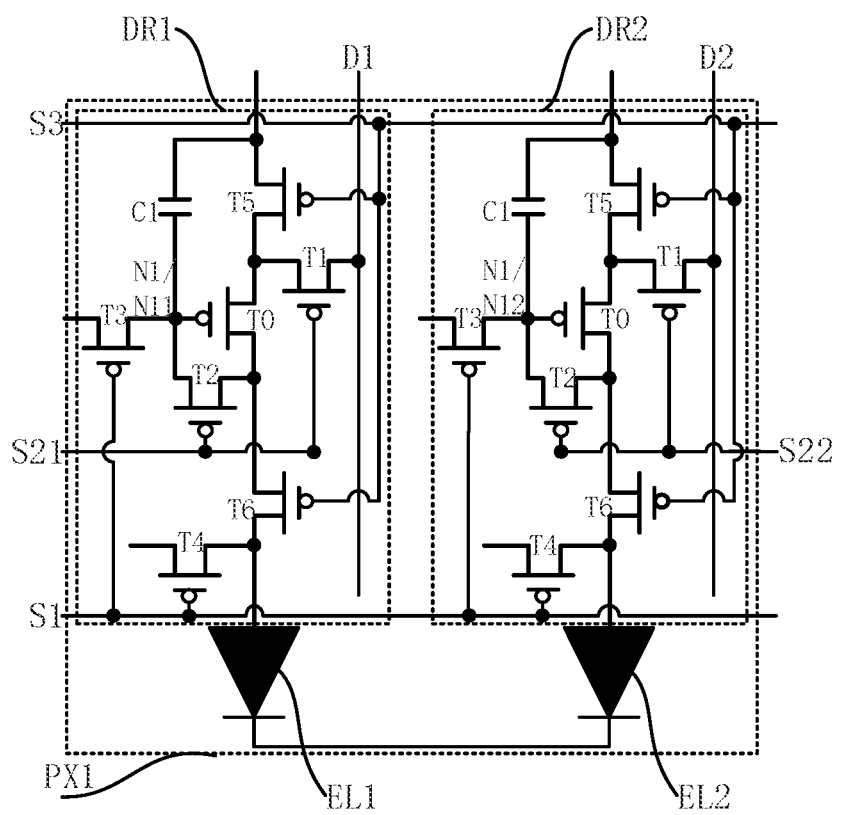
FIG. 21 is another equivalent circuit diagram of a first pixel of a display panel provided by an embodiment of the present disclosure.
Figure 22:
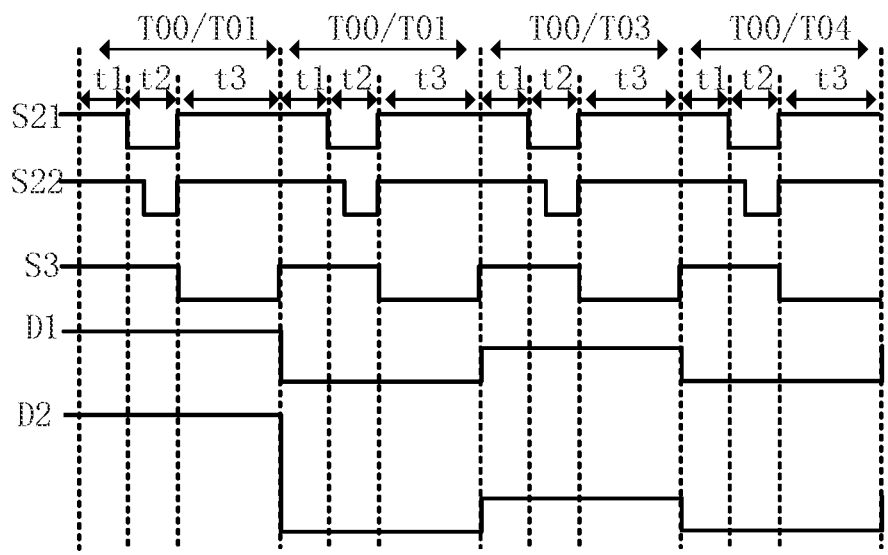
FIG. 22 is a timing sequence of a circuit shown in FIG. 21.

In an embodiment, referring to FIG. 21 and FIG. 22, the gate electrode of the data writing transistor T1 and the gate electrode of the threshold capturing transistor T2 of the first pixel circuit DR1 are both electrically connected to a scanning line S21, and the gate electrode of the data writing transistor T1 and the gate electrode of the threshold capturing transistor T2 of the second pixel circuit DR2 are both electrically connected to a scanning line S22. Then, during the data writing stage t2 of any one working cycle T00, the scanning line S21 controls the data writing transistor T1 and the threshold capturing transistor T2 of the first pixel circuit DR1 to be turned on for a period which is longer than a period for the scanning line S22 to control the data writing transistor T1 and the threshold capturing transistor T2 of the second pixel circuit DR2 to be turned on.

In the technical solutions of the present disclosure, by adjusting the moments when the scanning line S21 and the scanning line S22 start to transmit corresponding valid signals, a period for the data writing transistor T1of the first pixel circuit DR1 to transmit a data voltage to the gate electrode of the driving transistor T0 is longer than a period for the data writing transistor T1 of the second pixel circuit DR2 to transmit a data voltage to the gate electrode of the driving transistor T0 of the of the second pixel circuit DR2.

Figure 23:
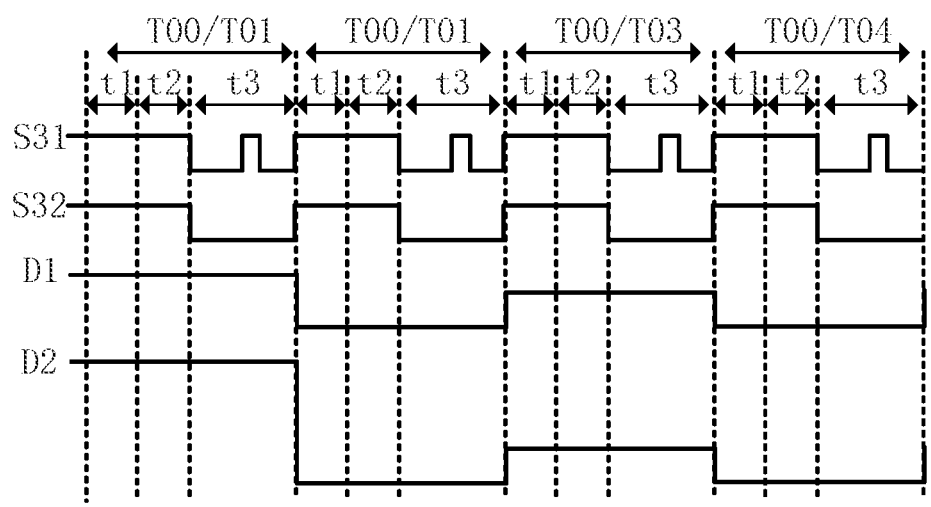
FIG. 23 is another timing sequence of a first pixel circuit and a second pixel circuit in a first sub-pixel.

FIG. 23 is another timing sequence of a first pixel circuit and a second pixel circuit in a first sub-pixel.

In the technical solution of the embodiments of the present disclosure, referring to FIG. 9 and FIG. 23, the first pixel circuit DR.1 is electrically connected to a first light-emitting control line 31, and the second pixel circuit DR2 is electrically connected to a second light-emitting control line 32. In a same first sub-pixel PX11, when the display panel displays a frame of an image, a period for the first light-emitting control line 31 to control the first pixel circuit DR1 to provide a light-emitting driving current to the first light-emitting element EL1 is shorter than a period for the second light-emitting control line 32 to control the second pixel circuit DR2 to provide a light-emitting driving current to the second light-emitting element EL2. In this case, by reducing the light-emitting duration of the first light-emitting element EL1 close to the chamfer CL in the first sub-pixel PX11, the light-emitting brightness of the first light-emitting element EL1 can be reduced, then the data voltage received by the first pixel circuit DR1 of the first sub-pixel PX11, which is higher than the data voltage received by the second pixel circuit DR2, does not need to be too large to alleviate the displaying sawtooth at the chamfer CL, thereby reducing the power consumption of the display panel.

In an embodiment, as shown in FIG. 23, a duty ratio of a valid signal transmitted by the first light-emitting control line 31 during the light-emitting stage t3 can be reduced, that is, a duty ratio of a low-level signal transmitted by the first light-emitting control line 31 can be reduced.

In an embodiment, during the light-emitting stage t3, the first light-emitting control line 31 can be a multi-pulse signal, and a turn-on frequency of the light-emitting control transistor T6 is increased, which can achieve a low gray level with the first light-emitting element EL1 of the first sub-pixel PX11 to alleviate the sawtooth, and can avoid the decrease of the light-emitting brightness of the first light-emitting element EL1 of the first sub-pixel PX11.

The present disclosure further provides a method for driving a display panel and can be used to drive the display panel provided by any one of the above embodiments.

With reference to FIG. 1, FIG. 2, and FIG. 4, the display panel includes multiple first pixels PX1. The first pixel PX1 includes a first light-emitting element EL1 and a second light-emitting element EL2. A first electrode 11 of the first light-emitting element EL1 and a first electrode 21 of the second light-emitting element EL2 are independent from each other. A second electrode 12 of the first light-emitting element EL1 is electrically connected to a second electrode 22 of the second light-emitting element EL2. A light-emitting material layer 13 of the first light-emitting element EL1 and a light-emitting material layer 23 of the second light-emitting element EL2 are formed into one piece.

In an embodiment, the first pixel PX1 further includes a first pixel circuit DR1 and a second pixel circuit DR2, the first pixel circuit DR1 is electrically connected to the first electrode 11 of the first light-emitting element EL1 and configured to provide a light-emitting driving current to the first light-emitting element EL1, and the second pixel circuit DR2 is electrically connected to the first electrode 21 of the second light-emitting element EL2 and configured to provide a light-emitting driving current to the second light-emitting element EL2.

As shown in FIG. 2, in the first pixel circuit DR1, a first node N Ito which the gate electrode of the driving transistor T0 is electrically connected is the first node N11, and the data writing transistor T1 receives a data voltage and then writes the data voltage to the first node N11. As shown in FIG. 2, in the second pixel circuit DR2, the first node N1 to which the gate electrode of the driving transistor T0 is electrically connected is the first node N12, and the data writing transistor T1 receives a data voltage and writes the data voltage to the first node N12. In this case, the potential of the first node Ni I and the potential of the first node N12 can reflect the data voltage received by the first pixel circuit DR1 and the data voltage received by the second pixel circuit DR2, respectively.

With reference to FIG. 2 and FIG. 3, the method for driving the display panel provided by an embodiment of the present disclosure includes: when the display panel displays at least one frame of an image, that is, during at least one working cycle T00, setting a data voltage received by the first pixel circuit DR1 to be different from a data voltage received by the second pixel circuit DR2 in a same first pixel PX1.

In the method for driving the display panel provided by an embodiment of the present disclosure, a high potential and a low potential of the data voltage received by the first pixel circuit DR1 can continuously repeat, and a high potential and a low potential of the data voltage received by the second pixel circuit DR2 can continuously repeat. In this way, the hysteresis effect of the driving transistor T0 of the first pixel circuit DR1 and the hysteresis effect of the driving transistor T0 of the second pixel circuit DR2 can be reduced, thereby reducing an influence of the hysteresis effect of the pixel circuit on the light-emitting brightness of the first pixel PX1, and thus ensuring the display effect of the display panel.

In the technical solutions of the embodiments of the present disclosure, when the display panel continuously displays at least two frames of a same image, the at least two frames of a same image include a first frame of the image and a second frame of the image. As shown in FIG. 3, when the display panel displays the first frame of the image, the working cycle T00 corresponding to the first pixel circuit DR1 and the second pixel circuit DR2 in a same first pixel PX1 is the working cycle T01; and When the display image displays the second frame of the image, the working cycle T00 corresponding to the first pixel circuit DR1 and the second pixel circuit DR2 in a same first pixel PX1 is the working cycle T02.

When the display panel displays the first frame of the image and the second frame of the image, the first pixel circuit DR1 receives different data voltages. That is, during the working cycle 101 and the working cycle T02, the first pixel circuit DR1 receives different data voltages. When the display panel displays the first frame of the image and the second frame of the image, the second pixel circuit DR2 receives different data voltages, That is, during the working cycle T01 and the working cycle 102, the second pixel circuit DR2 receives different data voltages, When the display panel provided by the embodiments of the present disclosure continuously displays a same image, the potentials of the gate electrodes of the driving transistors T0 of the first pixel circuit DR1 and the second pixel circuit DR1 in a same first pixel PX1 are different from each other during the first frame of the image and the second frame of the image, so that the hysteresis effect of the driving transistors T0 of the first pixel circuit DR1 and the second pixel circuit DR2 can be effectively alleviated. In this way, the display panel provided by the embodiments of the present disclosure can display a clear still image. 101401 In the technical solutions of the embodiments of the present disclosure, with reference to FIG. 7 and FIG. 8, the first pixel circuit DR1 is electrically connected to the first data line D1, and the second pixel circuit DR2 is electrically connected to the second data line D2. In this case, the first data line D1 can transmit a data voltage required by the first pixel circuit DR1, and the second data line D2 can transmit a data voltage required by the second pixel circuit DR2.

When displaying the first frame of the image and the second frame of the image, the data voltages transmitted by the first data line D1 to the first pixel circuit DR1 are different from each other. When displaying the first frame of the image and the second frame of the image, the data voltages transmitted by the second data line D2 to the second pixel circuit DR2 are different from each other. That is, the data voltage transmitted by the first data line D1 to the first pixel circuit DR1 during the working cycle T01 is different from the data voltage transmitted by the first data line D1 to the first pixel circuit DR1 during the working cycle T02, and the data voltage transmitted by the second data line D2 to the second pixel circuit DR2 during the working cycle T01 is different from the data voltage transmitted by the second data line D2 to the second pixel circuit DR2 during the working cycle T02.

In the display panel provided in the embodiments of the present disclosure, different data voltages can be transmitted to different pixel circuits of a same first pixel PX1 through the first data line D1 and the second data line D2, respectively, thereby avoiding that the first pixel circuit DR1 and the second pixel circuit DR2 in a same first pixel PX1 share a same data line, that is, avoiding increase of the power of the display panel caused by increasing a changing frequency of a voltage of the data line, or, that is, avoiding decrease of a refresh rate of the display panel caused by lengthening the period for the data voltage to be written to the pixel circuit.

In the technical solution of an embodiment of the present disclosure, as shown in FIG. 14, the display panel has a display area AA and a non-display area NA, and the non-display area NA may surround the display area AA. The display area AA includes a chamfered CL, that is, an outer contour of the display area AA is in a non-rectangular shape.

With reference to FIG. 14, FIG. 15, and FIG. 16, multiple pixels PX are arranged in the display area AA, and at least one of the multiple pixels PX is the first pixel PX1. The first pixel PX1 includes the first sub-pixel PX11 adjacent to the chamfer, that is, at least one first pixel PX1 is close to the chamfer CL, and the at least one first pixel PX1 is the first sub-pixel PX11 close to the chamfer CL. That is, the first sub-pixel PX11 is the first pixel PX1 of the multiple first pixels PX1 that is close to the chamfer CL.

As shown in FIG. 15 and FIG. 16, in the first sub-pixel PX11, the first light-emitting element EL1 is closer to the chamfer CL than the second light-emitting element EL2, When displaying a frame of an image, the data voltage received by the first pixel circuit DR1 in the first sub-pixel PX11 is greater than the data voltage received by the second pixel circuit DR2 in the first sub-pixel PX11, and thus, in the first sub-pixel PX11, the brightness of the first light-emitting element EL1 that is close to the chamfer CL is lower than the brightness of the second light-emitting element EL2 that is far away from the chamfer CL, thereby alleviating the displaying sawtooth at the chamfer when emitting light can be improved.

Figure 24:
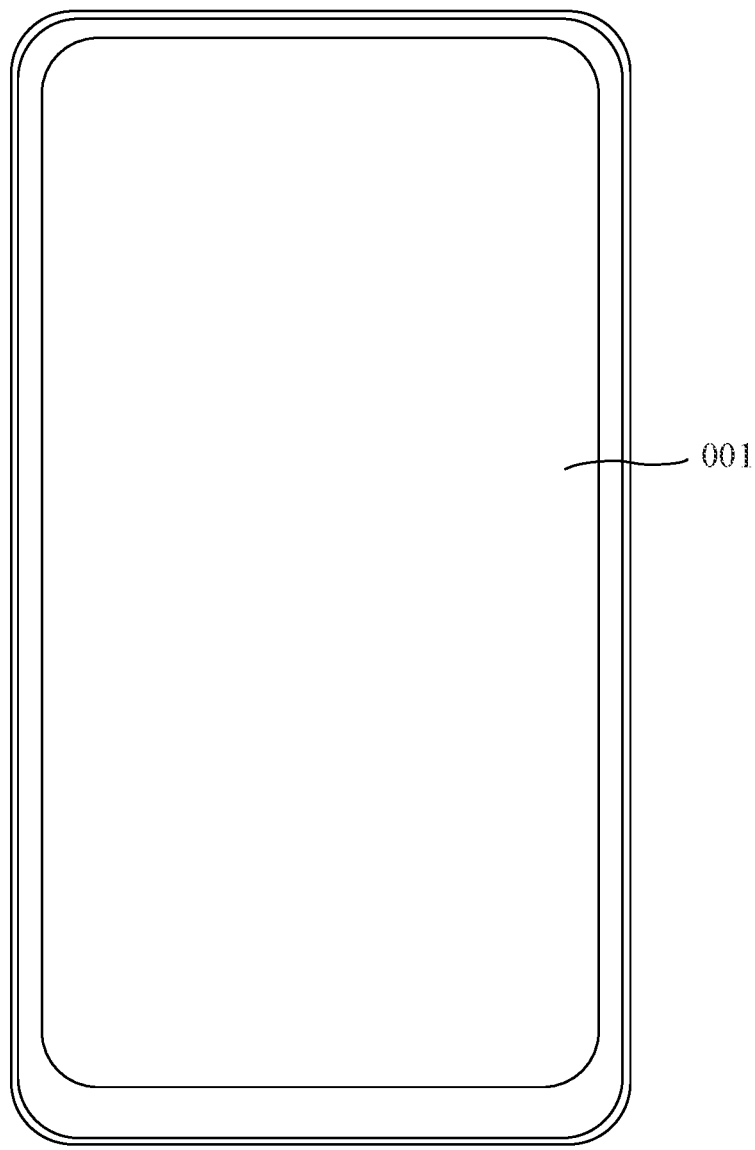
FIG. 24 is a schematic diagram of a display device according to an embodiment of the present disclosure.

FIG. 24 is a schematic diagram of a display device according to an embodiment of the present disclosure.

As shown in FIG. 24, an embodiment of the present disclosure provides a display device including the display panel 001 provided in any one of the foregoing embodiments. The display device provided by the embodiment of the present disclosure can be a mobile phone. The display device provided by the embodiment of the present disclosure can also be a display device such as a computer or a television.

The first pixel circuit DR1 and the second pixel circuit DR2 of the first pixel PX1 in the display device provided by the embodiment of the present disclosure provide the light-emitting driving currents to the first light-emitting element EL1 and the second light-emitting element EL2, respectively. A high potential and a low potential of the data voltage received by the first pixel circuit DR1 can continuously repeat, and a high potential and a low potential of the data voltage received by the second pixel circuit DR2 can continuously repeat. In this way, an influence of the hysteresis effect of the pixel circuit on the light-emitting brightness of the first pixel PX1 can be reduced, thereby ensuring the display effect of the display panel.

The above are merely some embodiments of the present disclosure, which, as mentioned above, are not intended to limit the present disclosure. Within a principle of the present disclosure, any modification, equivalent substitution, improvement shall fall into the protection scope of the present disclosure.

What is claimed is:

1. A display panel, comprising:
a plurality of first pixels,
wherein at least one of the first pixels each comprises:
a first light-emitting element and a second light-emitting element, wherein a first electrode of the first light-emitting element and a first electrode of the second light-emitting element are independent from each other; a second electrode of the first light-emitting element and a second electrode of the second light-emitting element are electrically connected to each other; and a first light-emitting material layer of the first light-emitting element and a second light-emitting material layer of the second light-emitting element are formed into one piece; and
a first pixel circuit and a second pixel circuit, wherein the first pixel circuit is electrically connected to the first electrode of the first light-emitting element, and the second pixel circuit is electrically connected to the first electrode of the second light-emitting element, wherein, when the display panel displays at least one frame of an image, a data voltage received by the first pixel circuit is different from a data voltage received by the second pixel circuit, wherein the at least one frame of the image comprises at least two frames of a same image that are continuously displayed on the display panel, and the at least two frames of the same image comprises a first frame of the image and a second frame of the image; and wherein a data voltage received by the first pixel circuit when displaying the first frame of the image is different from a data voltage received by the first pixel circuit when displaying the second frame of the image, and a data voltage received by the second pixel circuit when displaying the first frame of the image is different from a data voltage received by the second pixel circuit when displaying the second frame of the image; and/or wherein the display panel has a display area comprising a chamfer; wherein one of the at least one pixel comprises at least one first sub-pixel adjacent to the chamfer;

and wherein for each of the at least one first sub-pixel, the first light-emitting element is closer to the chamfer than the second light-emitting element; and when displaying a frame of the image, a first data voltage received by the first pixel circuit of the first sub-pixel is greater than a second data voltage received by the second pixel circuit.

2. The display panel according to claim 1, wherein the at least one frame of the image comprises at least two frames of a same image that are continuously displayed on the display panel, and the at least two frames of the same image comprises a first frame of the image and a second frame of the image; and wherein a data voltage received by the first pixel circuit when displaying the first frame of the image is different from a data voltage received by the first pixel circuit when displaying the second frame of the image, and a data voltage received by the second pixel circuit when displaying the first frame of the image is different from a data voltage received by the second pixel circuit when displaying the second frame of the image; and wherein the first pixel circuit is electrically connected to a first data line, and the second pixel circuit is electrically connected to a second data line;

wherein first data voltages transmitted by the first data line to the first pixel circuit when displaying the first frame of the image and the second frame of the image are different from each other, and second data voltages transmitted by the second data line to the second pixel circuit when displaying the first frame of the image and the second frame of the image are different from each other.

3. The display panel according to claim 2, wherein the first data voltage transmitted by the first data line to the first pixel circuit when displaying the first frame of the image is smaller than the second data voltage transmitted by the second data line to the second pixel circuit when displaying the first frame of the image; and the first data voltage transmitted by the first data line to the first pixel circuit when displaying the second frame of the image is greater than the second data voltage transmitted by the second data line to the second pixel circuit when displaying the second frame of the image.

4. The display panel according to claim 3, wherein when displaying the first frame of the image, the first data line transmits a bright-state data voltage to the first pixel circuit, and the second data line transmits a dark-state data voltage to the second pixel circuit; and when displaying the second frame of the image, the first data line transmits a dark-state data voltage to the first pixel circuit, and the second data line transmits a bright-state data voltage to the second pixel circuit.

5. The display panel according to claim 3, wherein when displaying the first frame of the image, the first data line and the second data line transmit bright- state data voltages to the first pixel circuit and the second pixel circuit, respectively; and when displaying the second frame of the image, the first data line and the second data line transmit bright-state data voltages to the first pixel circuit and the second pixel circuit, respectively.

6. The display panel according to claim 3, wherein the first frame image and the second frame image are displayed continuously.

7. The display panel according to claim 3, wherein the at least two frames of the same image that are continuously displayed on the display panel further comprise a third frame of the image displayed between the first frame of the image and the second frame of the image; and when sequentially displaying the first frame of the image, the third frame of the image, and the second frame of the image, first data voltages transmitted by the first data line to the first pixel circuit gradually increase, and second data voltages transmitted by the second data line to the second pixel circuit gradually decrease.

8. The display panel according to claim 1, wherein the at least one frame of the image comprises at least two frames of a same image that are continuously displayed on the display panel, and the at least two frames of the same image comprises a first frame of the image and a second frame of the image; and wherein a data voltage received by the first pixel circuit when displaying the first frame of the image is different from a data voltage received by the first pixel circuit when displaying the second frame of the image, and a data voltage received by the second pixel circuit when displaying the first frame of the image is different from a data voltage received by the second pixel circuit when displaying the second frame of the image; and wherein for a same one of the at least one first pixel, the first pixel circuit and the second pixel circuit are connected to a same light-emitting control line.

9. The display panel according to claim 1, wherein the at least one frame of the image comprises at least two frames of a same image that are continuously displayed on the display panel, and the at least two frames of the same image comprises a first frame of the image and a second frame of the image; and wherein a data voltage received by the first pixel circuit when displaying the first frame of the image is different from a data voltage received by the first pixel circuit when displaying the second frame of the image, and a data voltage received by the second pixel circuit when displaying the first frame of the image is different from a data voltage received by the second pixel circuit when displaying the second frame of the image; and wherein the first pixel circuit is connected to a first light-emitting control line, and the second pixel circuit is connected to a second light-emitting control line;

when displaying the first frame of the image, the first light-emitting control line transmits a control signal to the first pixel circuit, to cause the first pixel circuit to provide a light-emitting driving current to the first light-emitting element;

when displaying the second frame of the image, the second light-emitting control line transmits a control signal to the second pixel circuit, to cause the second pixel circuit to provide a light-emitting driving current to the second light-emitting element.

10. The display panel according to claim 1, wherein the display panel has a display area comprising a chamfer; wherein one of the at least one pixel comprises at least one first sub-pixel adjacent to the chamfer; and wherein for each of the at least one first sub-pixel, the first light-emitting element is closer to the chamfer than the second light-emitting element; and when displaying a frame of the image, a first data voltage received by the first pixel circuit of the first sub-pixel is greater than a second data voltage received by the second pixel circuit;

wherein the first pixel circuit is electrically connected to a first data line, and the second pixel circuit is electrically connected to a second data line; and wherein for a same one of the at least one first sub-pixel, when the display panel displays a frame of the image, a period during which the first data line transmits the firstdata voltage to the first pixel circuit is longer than a period during which the second data line transmits the second data voltage to the second pixel circuit.

11. The display panel according to claim 1, wherein the display panel has a display area comprising a chamfer; wherein one of the at least one pixel comprises at least one first sub-pixel adjacent to the chamfer; and wherein for each of the at least one first sub-pixel, the first light-emitting element is closer to the chamfer than the second light-emitting element; and when displaying a frame of the image, a first data voltage received by the first pixel circuit of the first sub-pixel is greater than a second data voltage received by the second pixel circuit; and wherein the first pixel circuit is electrically connected to a first data line, and the second pixel circuit is electrically connected to a second data line; and wherein for a same one of the at least one first sub-pixel, when the display panel displays a frame of the image, the first data voltage transmitted by the first data line to the first pixel circuit is greater than the second data voltage transmitted by the second data line to the second pixel circuit.

12. The display panel according to claim 1, wherein the display panel has a display area comprising a chamfer; wherein one of the at least one pixel comprises at least one first sub-pixel adjacent to the chamfer; and wherein for each of the at least one first sub-pixel, the first light-emitting element is closer to the chamfer than the second light-emitting element; and when displaying a frame of the image, a first data voltage received by the first pixel circuit of the first sub-pixel is greater than a second data voltage received by the second pixel circuit; and wherein the first pixel circuit is electrically connected to a first light-emitting control line, and the second pixel circuit is electrically connected to a second light-emitting control line; and wherein for a same one of the at least one first sub-pixel, when the display panel displays a frame of the image, a period during which the first light-emitting control line controls the first pixel circuit to provide a first light-emitting driving current to the first light-emitting element is shorter than a period during which the second light-emitting control line controls the second pixel circuit to provide a second light-emitting driving current to the second light-emitting element.

13. The display panel according to claim 1, wherein the display panel has a display area comprising a chamfer; wherein one of the at least one pixel comprises at least one first sub-pixel adjacent to the chamfer; and wherein for each of the at least one first sub-pixel, the first light-emitting element is closer to the chamfer than the second light-emitting element; and when displaying a frame of the image, a first data voltage received by the first pixel circuit of the first sub-pixel is greater than a second data voltage received by the second pixel circuit; and
  wherein each of the first pixel circuit and the second pixel circuit comprises a driving transistor and a data writing transistor, wherein the data writing transistor is configured to write a data voltage to a gate electrode of the driving transistor; and
  for a same one of the at least one first sub-pixel, when the display panel displays the frame of the image, a period during which the data writing transistor of the first pixel circuit transmits the first data voltage to the gate electrode of the driving transistor of the first pixel circuit is longer than a period during which the data writing transistor of the second pixel circuit transmits the second data voltage to the gate electrode of the driving transistor of the second pixel circuit.

14. The display panel according to claim 1, wherein the display panel has a display area comprising a chamfer; wherein one of the at least one pixel comprises at least one first sub-pixel adjacent to the chamfer; and wherein for each of the at least one first sub-pixel, the first light-emitting element is closer to the chamfer than the second light-emitting element; and when displaying a frame of the image, a first data voltage received by the first pixel circuit of the first sub-pixel is greater than a second data voltage received by the second pixel circuit; and
  wherein for each of the at least one first sub-pixels, a first area of the first light-emitting element is smaller than a second area of the second light-emitting element.

15. A method for driving a display panel, wherein the display panel comprises first pixels, wherein at least one of the first pixels each comprises:
  A first light-emitting element and a second light-emitting element, wherein a first electrode of the first light-emitting element and a first electrode of the second light-emitting element are independent from each other; a second electrode of the first light-emitting element and a second electrode of the second light-emitting element are electrically connected to each other; and a first light-emitting material layer of the first light-emitting element and a second light-emitting material layer of the second light-emitting element are formed into one piece; and
  a first pixel circuit and a second pixel circuit, wherein the first pixel circuit is electrically connected to the first electrode of the first light-emitting element, and the second pixel circuit is electrically connected to the first electrode of the second light-emitting element,
  wherein the method comprises:
  when the display panel displays at least one frame of an image, setting a first data voltage received by the first pixel circuit to be different from a second data voltage received by the second pixel circuit,
  wherein the at least one frame of the image comprises at least two frames of a same image that are continuously displayed on the display panel, and the at least two frames of the same image comprise a first frame of the image and a second frame of the image; a first data voltage received by the first pixel circuit when displaying the first frame of the image is different from the first data voltage received by the first pixel circuit when displaying the second frame of the image; and a second data voltage received by the second pixel circuit when displaying the first frame of the image is different from the second data voltage received by the second pixel circuit when displaying the second frame of the image, and/or
  the display panel has a display area comprising a chamfer; wherein one of the at least one pixel comprises at least one first sub-pixel adjacent to the chamfer; and wherein for each of the at least one first sub-pixel, the first light-emitting element is closer to the chamfer than the second light-emitting element; and wherein the method further comprises: for each of the at least one first sub-pixel, when the display panel displays a frame of an image, setting a first data voltage received by the first pixel circuit to be greater than a second data voltage received by the second pixel circuit.

16. A display device, comprising a display panel comprising first pixels,
  wherein at least one of the first pixels each comprises:
  a first light-emitting element and a second light-emitting element, wherein a first electrode of the first light-emitting element and a first electrode of the second light-emitting element are independent from each other; a second electrode of the first light-emitting element and a second electrode of the second light-emitting element are electrically connected to each other; and a first light-emitting material layer of the first light-emitting element and a second light-emitting material layer of the second light-emitting element are formed into one piece; and
  a first pixel circuit and a second pixel circuit, wherein the first pixel circuit is electrically connected to the first electrode of the first light-emitting element, and the second pixel circuit is electrically connected to the first electrode of the second light-emitting element; and
  wherein for a same one of the at least one first pixel, when the display panel displays at least one frame of an image, a first data voltage received by the first pixel circuit is different from a second data voltage received by the second pixel circuit,
  wherein the at least one frame of the image comprises at least two frames of a same image that are continuously displayed on the display panel, and the at least two frames of the same image comprises a first frame of the image and a second frame of the image; and wherein a data voltage received by the first pixel circuit when displaying the first frame of the image is different from a data voltage received by the first pixel circuit when displaying the second frame of the image, and a data voltage received by the second pixel circuit when displaying the first frame of the image is different from a data voltage received by the second pixel circuit when displaying the second frame of the image; and/or
  wherein the display panel has a display area comprising a chamfer; wherein one of the at least one pixel comprises at least one first sub-pixel adjacent to the chamfer; and
  wherein for each of the at least one first sub-pixel, the first light-emitting element is closer to the chamfer than the second light-emitting element; and when displaying a frame of the image, a first data voltage received by the first pixel circuit of the first sub-pixel is greater than a second data voltage received by the second pixel circuit.

\* \* \* \* \*